(12) United States Patent
Goto et al.

(10) Patent No.: US 7,172,972 B2
(45) Date of Patent: Feb. 6, 2007

(54) SEMICONDUCTOR DEVICE MANUFACTURE METHOD AND ETCHING SYSTEM

(75) Inventors: Takeshi Goto, Kawasaki (JP); Mitsugu Tajima, Kawasaki (JP); Takayuki Yamazaki, Kawasaki (JP); Takaya Kato, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 218 days.

(21) Appl. No.: 10/883,828

(22) Filed: Jul. 6, 2004

(65) Prior Publication Data
US 2005/0009215 A1    Jan. 13, 2005

(30) Foreign Application Priority Data
Jul. 9, 2003   (JP) ............................. 2003-194380
May 27, 2004   (JP) ............................. 2004-158165

(51) Int. Cl.
*H01L 21/302*   (2006.01)
*H01L 21/461*   (2006.01)

(52) U.S. Cl. ................ 438/706; 438/725; 257/E21.024
(58) Field of Classification Search ................ 438/714, 438/725, 706; 257/E21.024, E21.026
See application file for complete search history.

(56) References Cited

U.S. PATENT DOCUMENTS 5,926,690 A * 7/1999 Toprac et al. ................. 438/17
2003/0165755 A1* 9/2003 Mui et al. ..................... 430/30

FOREIGN PATENT DOCUMENTS

JP   2000-77386   3/2000
JP   2003-31557   1/2003

* cited by examiner

*Primary Examiner*—Caridad Everhart
(74) *Attorney, Agent, or Firm*—Westerman, Hattori, Daniels & Adrian, LLP.

(57) ABSTRACT

A semiconductor device manufacture method includes the steps of forming a resist layer above a work target layer; exposing and developing the resist layer to form resist patterns including isolated pattern and dense patterns; monitoring widths of isolated and dense pattern of the resist patterns to determine trimming amounts of linewidths to be reduced; determining etching conditions for realizing the trimming amounts of both the isolated and dense patterns, the etching conditions using mixed gas of a gas having a function of mainly enhancing etching and a gas having a function of mainly suppressing etching; trimming the resist pattern under said determined etching conditions; and etching the work target layer by using said trimmed resist patterns. A desired pattern width an be realized stably by trimming using plasma etching.

19 Claims, 23 Drawing Sheets

ISO

DNS

O₂ GAS-FLOW-RATE FRACTION (%)

GATE LENGTH REDUCTION AMOUNT y (nm)

| CONDITION | SO2 (sccm) | O2(sccm) | He(sccm) | He DILUTION RATIO (%) | SO2 GAS-FLOW -RATE FRACTION (%) |
|---|---|---|---|---|---|
| 1 | 14.8 | 42.2 | 30 | 34 | 26 |
| 2 | 12.2 | 34.8 | 40 | 46 | 26 |
| 3 | 9.6 | 27.4 | 50 | 57 | 26 |
| 4 | 4.4 | 12.6 | 70 | 80 | 26 |

PLASMA PROCESS CHAMBER PRESSURE   5mtorr
PLASMA GENERATION POWER   300W
BIAS VOLTAGE  Vpp   100V
GAS   He+$SO_2$+$O_2$
He DILUTION RATIO (%) = ([He]/[He+ $SO_2$+$O_2$]) × 100
$SO_2$ GAS-FLOW-RATE FRACTION (%) = ([$SO_2$]/[$SO_2$+$O_2$]) × 100

FIG.9

| SO2 GAS-FLOW -RATE FRACTION (%) \ He DILUTION RATIO (%) | 50 | 60 | 70 | 80 | 90 | |
|---|---|---|---|---|---|---|
| 15.47 | S11 | S12 | S13 | S14 | S15 | VD1 |
| 20.62 | S21 | S22 | S23 | S24 | S25 | VD2 |
| 25.32 | S31 | S32 | S33 | S34 | S35 | VD3 |
| 29.72 | S41 | S42 | S43 | S44 | S45 | VD4 |
| 34.91 | S51 | S52 | S53 | S54 | S55 | VD5 |
| | VF1 | VF2 | VF3 | VF4 | VF5 | |

TOTAL FLOW RATE   130.5 sccm   FIXED
OVER ETCH TIME   50% FIXED

| SLOPE BY SO₂ | ISO | DNS |
|---|---|---|
| vf1 | (0.714) | (0.611) |
| vf2 | (0.746) | (0.612) |
| vf3 | (0.712) | (0.633) |
| vf4 | (0.775) | (0.625) |
| vf5 | (0.758) | (0.634) |
| AVE | (0.741) | (0.623) |

| SLOPE BY DHe | ISO | DNS |
|---|---|---|
| vd1 | 0.224 | 0.148 |
| vd2 | 0.223 | 0.127 |
| vd3 | 0.201 | 0.125 |
| vd4 | 0.197 | 0.118 |
| vd5 | 0.160 | 0.156 |
| AVE | 0.201 | 0.135 |

$y(ISO) = -0.741X + 0.201Z + 45.63$ $y(DNS) = -0.623X + 0.135Z + 38.10$

FIG.15A
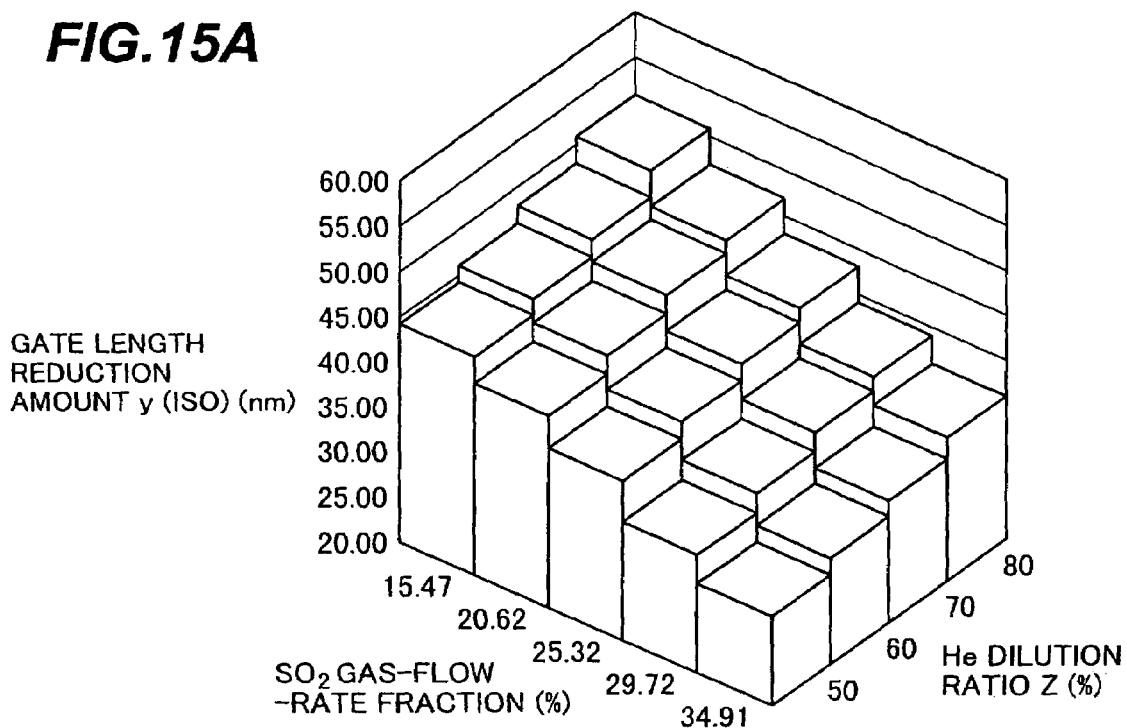
FIG.15B
$y(ISO) = -0.741X + 0.201Z + 45.63$
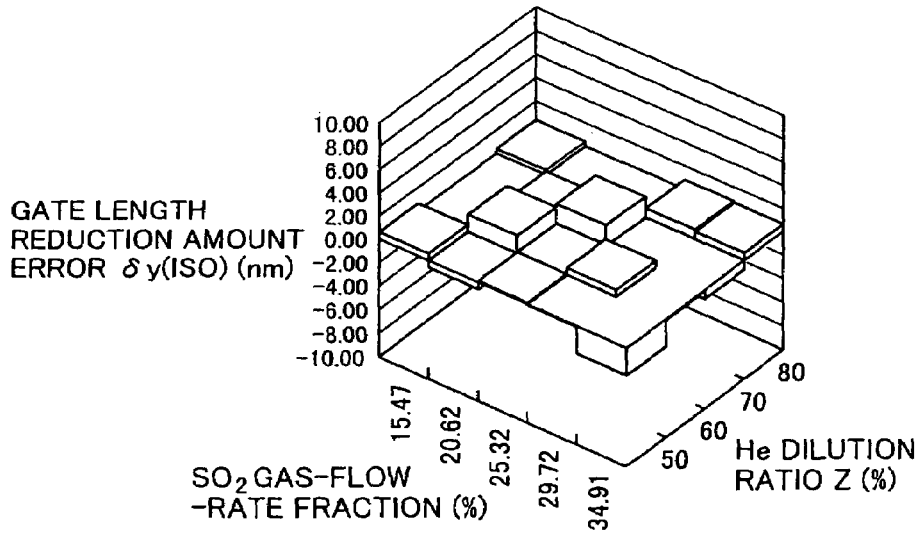
FIG.15C
|  | .15.47 | 20.62 | 25.32 | 29.72 | 34.91 |
|---|---|---|---|---|---|
| ☐50 | 0.59 | -0.61 | 0.04 | -0.05 | -2.28 |
| ☐60 | -1.26 | 1.51 | 0.06 | 0.61 | -0.54 |
| ☐70 | -0.61 | 0.33 | 1.85 | -0.21 | -0.82 |
| ☐80 | 0.36 | -0.63 | -0.32 | 0.82 | 0.64 |

FIG.16A
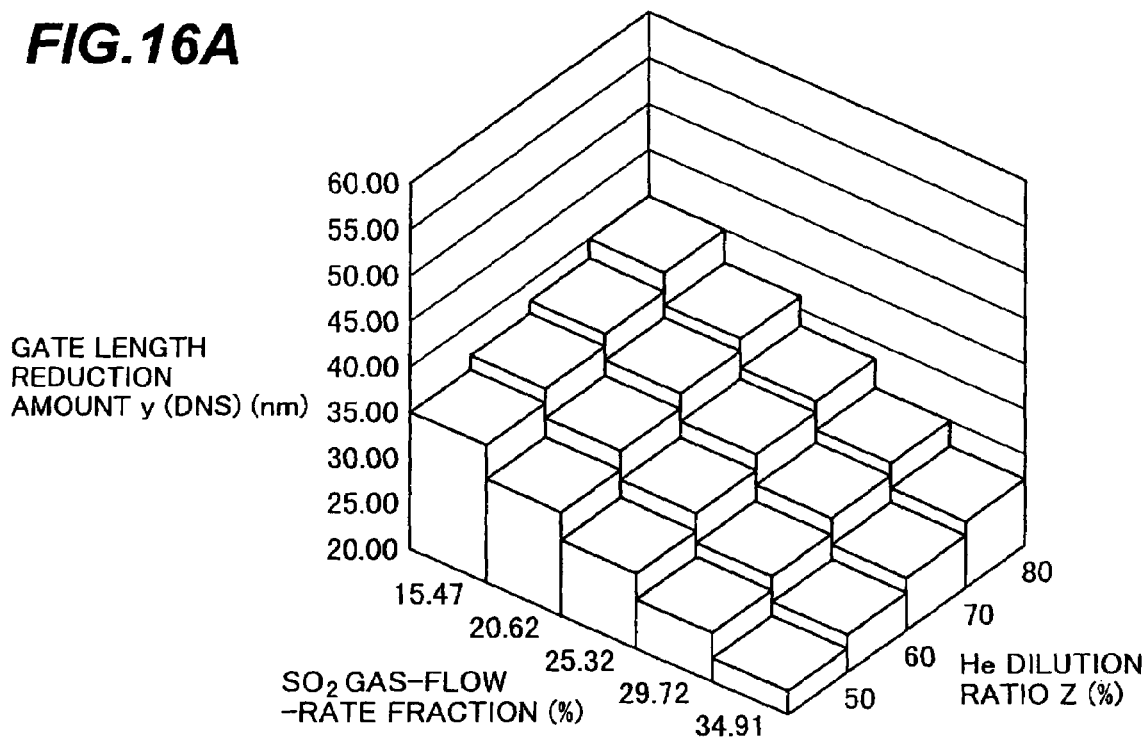
FIG.16B
$y(DNS) = -0.623X + 0.135Z + 38.10$
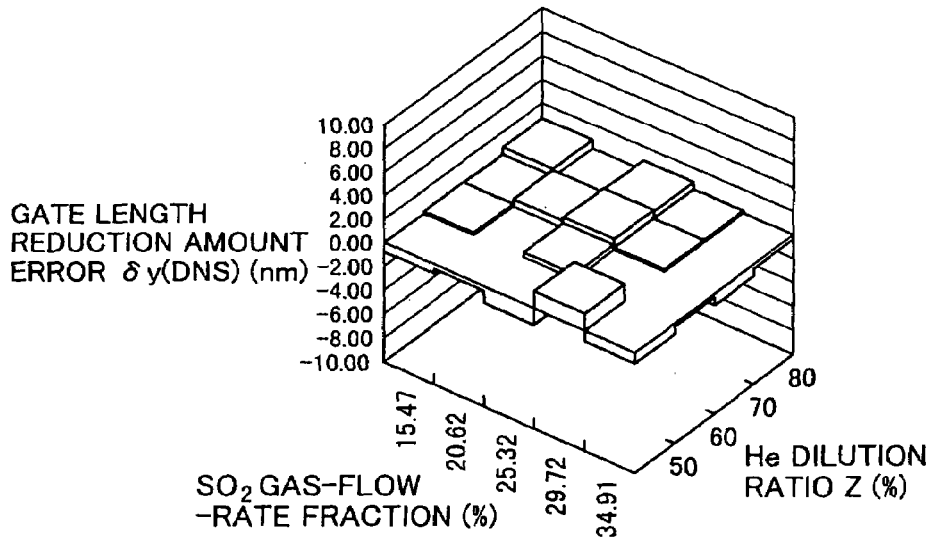
FIG.16C
|  | 15.47 | 20.62 | 25.32 | 29.72 | 34.91 |
|---|---|---|---|---|---|
| ☐50 | -0.83 | -0.48 | -1.47 | 1.47 | -0.90 |
| ☐60 | 0.26 | -0.68 | 0.47 | -0.15 | -0.28 |
| ☐70 | 0.13 | 0.58 | 0.87 | 0.22 | -0.97 |
| ☐80 | 0.80 | -0.67 | 0.76 | 0.19 | -0.40 |

|      | 15.47 | 20.62 | 25.32 | 29.72 | 34.91 |
|------|-------|-------|-------|-------|-------|
| □50  | 9.01  | 8.42  | 7.85  | 7.26  | 6.65  |
| □60  | 9.63  | 9.10  | 8.49  | 7.96  | 7.35  |
| □70  | 10.29 | 9.80  | 9.23  | 8.69  | 8.01  |
| □80  | 11.09 | 10.38 | 9.83  | 9.27  | 8.73  |

FIG.18

| RECIPE No. | RECIPE NAME | DNS GATE LENGTH REDUCTION AMOUNT (nm) | SO₂ GAS -FLOW-RATE FRACTION (%) | He DILUTION RATIO Z (%) |
|---|---|---|---|---|
| 1 | APC01 | 36.5 | 12.4 | 45.2 |
| 2 | APC02 | 36.0 | 13.6 | 47.1 |
| 3 | APC03 | 35.5 | 14.8 | 48.9 |
| 4 | APC04 | 35.0 | 16.0 | 50.8 |
| 5 | APC05 | 34.5 | 17.2 | 52.6 |
| 6 | APC06 | 34.0 | 18.4 | 54.5 |
| 7 | APC07 | 33.5 | 19.6 | 56.4 |
| 8 | APC08 | 33.0 | 20.8 | 58.2 |
| 9 | APC09 | 32.5 | 22.0 | 60.1 |
| 10 | APC10 | 32.0 | 23.2 | 62.0 |
| 11 | APC11 | 31.5 | 24.4 | 63.8 |
| 12 | APC12 | 31.0 | 25.6 | 65.7 |
| 13 | APC13 | 30.5 | 26.8 | 67.5 |
| 14 | APC14 | 30.0 | 28.0 | 69.4 |
| 15 | APC15 | 29.5 | 29.2 | 71.3 |
| 16 | APC16 | 29.0 | 30.4 | 73.1 |
| 17 | APC17 | 28.5 | 31.7 | 75.0 |
| 18 | APC18 | 28.0 | 32.9 | 76.8 |
| 19 | APC19 | 27.5 | 34.1 | 78.7 |
| 20 | APC20 | 27.0 | 35.3 | 80.6 |
| 21 | APC21 | 26.5 | 36.5 | 82.4 |
| 22 | APC22 | 26.0 | 37.7 | 84.3 |
| 23 | APC23 | 25.5 | 38.9 | 86.1 |
| 24 | APC24 | 25.0 | 40.1 | 88.0 |
| 25 | APC25 | 24.5 | 41.3 | 89.9 |

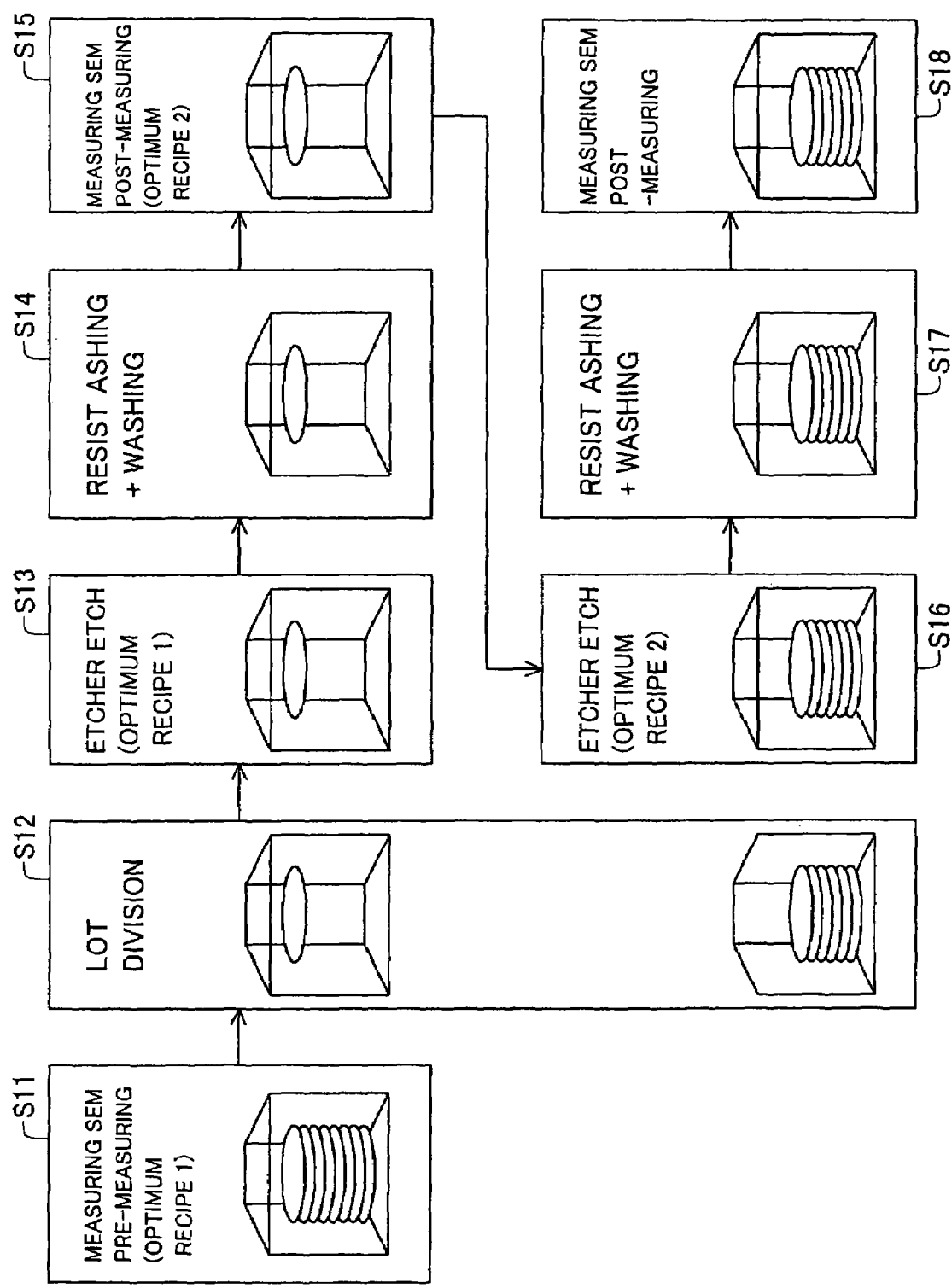

SEMICONDUCTOR DEVICE MANUFACTURE METHOD AND ETCHING SYSTEM

CROSS REFERENCE TO RELATED APPLICATION

This application is based on and claims priority of Japanese Patent Applications No. 2003-194380 filed on Jul. 9, 2003 and No. 2004-158165 filed on May 27, 2004, the entire contents of which are incorporated herein by reference.

BACKGROUND OF THE INVENTION

A) Field of the Invention

The present invention relates to a semiconductor device manufacture method and an etching system, and more particularly to a semiconductor device manufacture method including a process of trimming fine resist pattern such as a pattern used for patterning gate electrodes, and an etching system suitable for embodying this method.

B) Description of the Related Art

The operation speed of a MOS transistor is greatly influenced by a gate length. The shorter the gate length, the high speed operation of the transistor becomes easier. As the gate length is shortened by scaling, the gate length of 100 nm or shorter has been adopted. Such a short gate length is in excess of a photography resolution in some cases. If a gate electrode is etched by using a resist pattern itself, a gate electrode having a longer gate length than a desired size is formed.

A method of trimming a gate electrode once formed has been proposed by which after a gate electrode of polysilicon is formed, an oxide film is grown on side walls of the gate electrode through oxidation and then the oxide films are selectively etched to obtain a desired gate length (e.g., refer to Japanese Patent Laid-open Publication No. 2003-31557). With this method, a controlled oxidation process and a selective etching process are required to be added.

If the underlying layer of a resist layer including a layer to be etched has a high reflection factor such as polysilicon, a standing wave or halation may occur in the resist layer due to reflected light. In order to eliminate a standing wave and halation, a bottom anti-reflection coating (BARC) is formed under the resist layer. As BARC, an organic compound layer is widely used which has a similar composition to that of the resist layer although it has no photosensitivity.

After a BARC layer and a resist layer are formed, the resist layer is exposed and developed to form resist pattern, and then by using the resist pattern as a mask, the BARC layer is etched. If the BARC layer has a similar composition to that of the resist layer, the resist pattern is etched while the BARC layer is etched so that the size of the resist pattern is reduced.

It is said that thinning of a resist pattern can be suppressed by providing adhesion to side walls of the resist pattern by using mixed gas of oxygen gas and gas having a deposition nature such as freon. However, adhesion given to the side walls of a resist pattern is dependent upon the density of resist patterns. It is also said that there occurs a size difference between resist patterns after etching, depending upon the density of resist patterns.

A method of reducing a size difference depending on the density of resist patterns has been proposed (e.g., refer to Japanese Patent Laid-open Publication No. 2000-77386). According to this method, first main etching is executed by using mixed gas of chlorine and oxygen to minimize a conversion difference due to the pattern density, and next over etching is executed by using only halogen hydrocarbon gas, to sputter resist of the mask in an area where the patterns are dense to deposit it on side walls so that the pattern size is made thick so that a conversion difference between the resist pattern width and the anti-reflection film width is removed.

The phenomenon that a resist pattern width is reduced during patterning a BARC layer can be used for trimming a resist pattern. If a resist pattern for gate electrode patterning is to be trimmed, after a resist pattern is formed on the gate electrode layer, the width of the resist pattern is trimmed and reduced by oxygen plasma or the like, and the gate electrode layer is etched by using a narrowed resist pattern as a mask. Also in this case, the problem is the density difference between final resist pattern widths.

On the assumption that a trimming amount is dependent upon the density difference, it is possible to correct a reticle pattern for exposing resist, in order to make uniform the fine resist pattern widths. However, in the etching process, there exists a long term variation that etching products deposited on the wall of an etching system are released in a later etching process, and this long term variation changes the pattern widths due to a density difference. If this variation is to be dealt with reticle correction, the number of reticles becomes enormous, which is not practical. The pattern width of a resist layer obtained by an exposure/development process may be shifted from an expected pattern width. In this case, reticle correction provides no significant effects.

SUMMARY OF THE INVENTION

An object of this invention is to provide a semiconductor device manufacture method capable of stably realizing a target pattern width through trimming using plasma etching.

Another object of this invention is to provide a semiconductor device manufacture method capable of stably realizing a target pattern width through trimming using plasma etching, independently from the pattern density.

Another object of this invention is to provide an etching system suitable for the semiconductor device manufacture method.

According to one aspect of the present invention, there is provided a semiconductor device manufacture method includes the steps of forming a resist layer above a work target layer; exposing and developing the resist layer to form a resist pattern including isolated patterns and dense patterns; monitoring widths of each isolated pattern and each dense pattern of the resist pattern to determine trimming amounts of widths to be reduced; determining etching conditions realizing the trimming amounts of both the isolated and dense patterns, the etching conditions using a mixed gas of a gas having a function of mainly enhancing etching and a gas having a function of mainly suppressing etching; trimming the resist pattern under said determined etching conditions; and etching the work target layer by using said trimmed resist pattern.

According to another aspect of the present invention, there is provided an etching system comprising: a measuring apparatus capable of measuring a pattern width; an etching apparatus capable of trimming a resist pattern by using a mixed gas of a gas having a function of mainly enhancing etching and a gas having a function of mainly suppressing etching, and thereafter etching a work target layer under the resist pattern; and a controller for storing data representative of a relation of an isolated pattern width and a dense pattern width of the resist pattern relative to an isolated pattern width and a dense pattern width of the work target layer after etching, the relation depending upon etching conditions of the etching using the mixed gas, and etching conditions capable of realizing desired trimming amounts of the isolated pattern width and the dense pattern width of a given resist pattern, wherein the measuring apparatus has a feed forward series of measuring the pattern width of the resist pattern and transfer the measurement results to the controller, and the controller determines the etching conditions in accordance with the transferred resist pattern width and controls the etching apparatus.

The semiconductor manufacture method including an etching process capable of realizing a desired etching, amount even if there are dense and coarse pattern distributions.

Even if a resist pattern formed by photolithography has a pattern width shifted from an expected value, a desired pattern width can be realized eventually.

BRIEF DESCRIPTION OF THE DRAWINGS

FIG. 4 is a graph showing a control equation of a mode II.

FIG. 9 is a table showing the contents of samples.

FIGS. 15A to 15C are solid graphs and a table showing the relation of a gate length reduction amount of isolated patterns relative to an $SO_2$ gas-flow-rate fraction X and an He dilution ratio Z.

FIGS. 16A to 16C are solid graphs and a table showing the relation of a gate length reduction amount of dense patterns relative to the $SO_2$ gas-flow-rate fraction X and He dilution ratio Z.

FIG. 18 is a table showing an example of a recipe for obtaining the $SO_2$ gas-flow-rate fraction X and He dilution ratio Z from the gate length reduction amount difference between isolated and dense patterns and the gate length reduction amount of dense patterns.

FIG. 22 is a flow chart illustrating an etching process using a pilot wafer.

DESCRIPTION OF THE PREFERRED EMBODIMENTS

The present inventor has studied a method of forming a gate electrode having a gate length narrower than a scale limit of photolithography. If a resist pattern is trimmed by plasma etching, an etching rate changes with whether the density of patterns is dense or coarse, and gate lengths in a wafer become irregular.

If a resist pattern is formed on a BARC layer, the BARC layer is etched by using the resist pattern as a mask. Etching the resist pattern while the BARC layer is etched can be utilized for trimming. However, if the resist pattern is etched by plasma etching, the etching rate changes with the pattern density and resultant pattern widths are often irregular due to the influence of the pattern density.

As a method of correcting a difference among etching amounts to be caused by the pattern density, it is known that a mixed gas of a plurality of gasses having different etching characteristics is used. The present inventor has checked how a pattern width changes with the etching conditions of etching the BARC layer by using as an etching gas a mixed gas of a gas for mainly enhancing etching and a gas for mainly suppressing etching.

FIGS. 1A to 1E are plan views and cross sectional views illustrating a sample used for experiments.

Figure 1A:
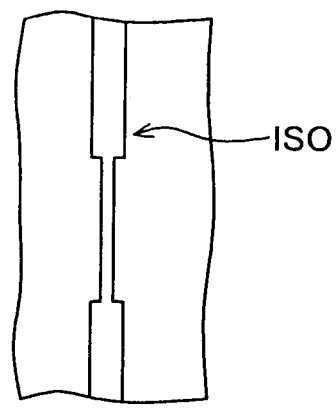
FIGS. 1A to 1E are plan views and cross sectional views illustrating a process of manufacturing an experimental sample.

FIG. 1A is a plan view showing an isolated pattern. The isolated pattern ISO is a single resist pattern isolated in a broad area.

Figure 1B:
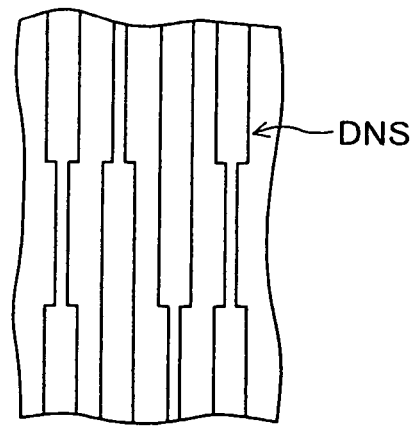

FIG. 1B shows an example of the layout of dense patterns. The dense patterns DNS has the layout of a plurality of patterns disposed densely.

Figure 1C:
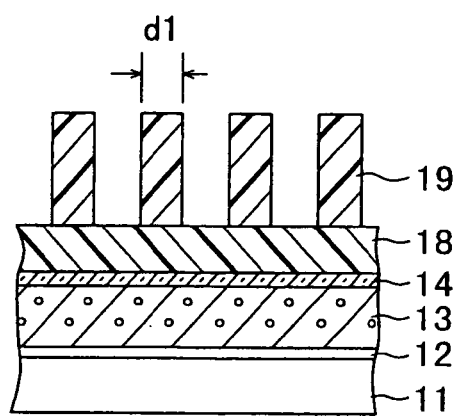
Figure 1D:
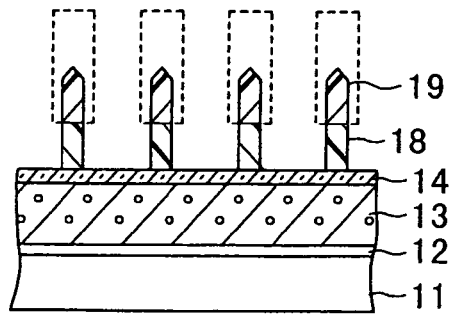
Figure 1E:
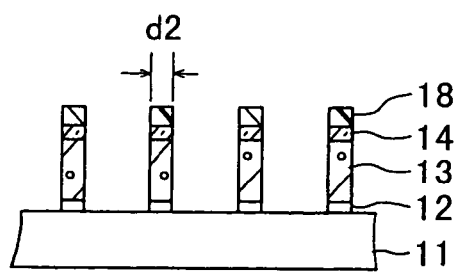

FIGS. 1C, 1D and 1E are cross sectional views illustrating the manufacture processes for a sample. As shown in FIG. 1C, a gate oxide film 12 of about 1 to 2 nm is formed on a silicon substrate 11. A gate electrode layer 13 of polysilicon having a thickness of 80 to 150 nm is formed on the gate oxide film. The polysilicon film 13 is, for example, 100 nm thick. A hard mask layer 14 of silicon oxide having a thickness of 10 to 70 nm is formed on the polysilicon film 13, the hard mask layer functioning as a hard mask when the polysilicon film 13 is etched. The hard mask layer 14 is, for example, 30 nm thick. The polysilicon layer 13 and hard mask layer 14 are target layers to be worked.

On the hard mask layer 14, a BARC layer 18 is coated to a thickness of 30 to 80 nm. Although the BARC layer 18 has no photosensitivity, it has the composition almost equivalent to resist. A resist layer of 200 to 300 nm in thickness is formed on the BARC layer 18 and exposed and developed to form a resist pattern 19 which is disposed in the layouts shown in FIGS. 1A and 1B. A width of the resist pattern 19 is represented by d1.

By using the resist pattern 19 as a mask, the underlying BARC layer 18 is etched. After the wafer to be etched is transported into an etching chamber, preparatory He gas plasma is ignited. The preparatory plasma trims by about 5 nm. Thereafter, main plasma etching of $He/SO_2/O_2$ is executed.

FIG. 1D shows the state that the BARC layer was etched by main etching and over etching. The resist pattern 19 reduces its height and width by etching while the BARC layer 18 is etched. The "main etching" is generally the etching until the surface of an underlying layer is exposed, and the "over etching" is the etching to be executed thereafter. Even if some underlying surfaces are exposed by the main etching, this does not mean that the predetermined whole area was completely etched. The over etching is therefore necessary.

The resist pattern 19 and underlying BARC layer pattern 18 are an etching mask for the work target layers. In this state, the hard mask layer 14 is etched to transfer the mask pattern. The polysilicon layer 13 under the hard mask layer 14 is etched. Even if the resist pattern 19 and BARC pattern 18 are extinguished, the hard mask layer 14 can function as the etching mask. FIG. 1E shows the state after the polysilicon layer 13 is etched. A width of a patterned polysilicon layer is represented by d2. The width d1 of the resist pattern 19 was trimmed to the width d2 of the polysilicon layer.

In the etching process for the BARC layer 18 shown in FIG. 1D, a mixed gas which contained $O_2$ gas and $SO_2$ gas was used as the etching gas. It was checked how the pattern width d2 of the finally obtained polysilicon layer pattern 13 was changed by adjusting the gas-flow-rate fraction (mixture ratio) of the mixed etching gas and an over etching time.

Figure 2A:
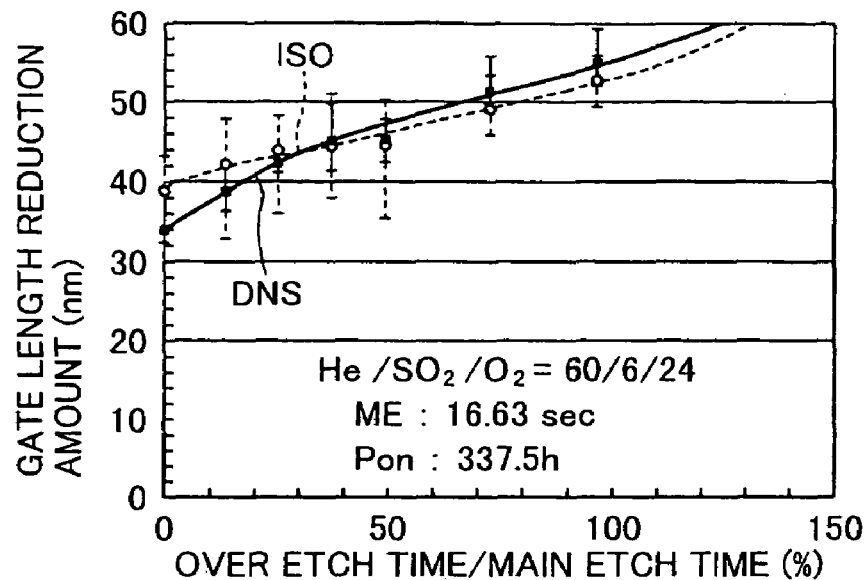
FIGS. 2A and 2B are graphs showing experiment results.

FIG. 2A is a graph obtained when a mixed gas of $He/SO_2/O_2=60/06/24$ was used as the etching gas. The abscissa represents a ratio of an over etching time to a main etching time in the unit of %. The ordinate represents a gate length (pattern width) reduction amount in the unit of nm.

A total plasma-on time after the ignition of plasma was 337.5 hours. Radiation of a CO bond emitted during etching the BARC layer was monitored and the time when the monitored radiation was reduced to 90% was considered as the completion of the main etching. The main etching was completed in 16.63 seconds.

It was checked how the pattern width changed with the over etching. As shown in FIG. 2A, at the start of the over etching, the width of the isolated pattern ISO is much narrower than the width of the dense pattern DNS. As the over etching progresses, a width difference is gradually reduced, the widths become equal and then an inverse width difference appears.

It is therefore possible to make the pattern width (gate length) reduction amounts of the isolated pattern and dense pattern have the same value, by selecting the over etching time or the ratio of the over etching time to the main etching time. The same pattern width reduction amount (trimming amount) was about 46 nm.

Figure 2B:
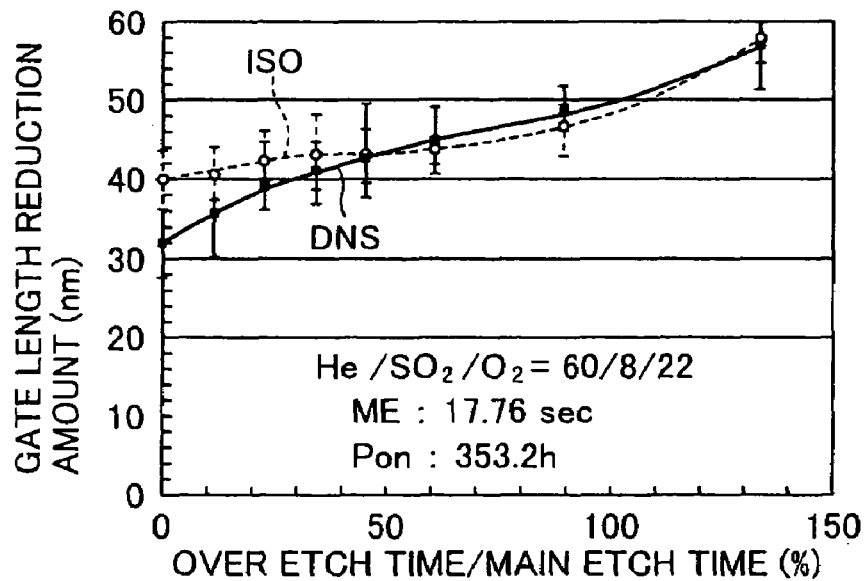

FIG. 2B is a graph obtained when a mixed gas of $He/SO_2/O_2=60/08/22$ was used as the etching gas. The main etching ME was terminated in 17.76 seconds. The total plasma-on time is 353.2 hours, which is not so different from the plasma-on time of 337.5 hours so that age deterioration in the plasma chamber can be almost neglected.

At the start of the over etching, a pattern length reduction amount difference between the isolated pattern ISO and dense pattern DNS is larger than that shown in FIG. 2A. Similar to FIG. 2A, as the over etching progresses, the difference reduces gradually, the reduction amounts become equal, and then an inverse length difference appears. The pattern length reduction amount when both the isolated and dense patterns become coincident was about 43 nm.

As above, while the main etching and over etching are performed, the peripheral status changes with the main etching and over etching. Therefore, a pattern length reduction amount difference between the isolated and dense patterns takes a positive value at the start of the over etching, and the positive value becomes small as the over etching progresses and inverted to a negative value. During this etching, there is the condition that both the pattern length reduction amounts are made equal.

If the developed resist pattern widths have the same value for the isolated pattern and dense pattern, the isolated pattern and dense pattern having the same length can be finally formed by selecting the over etching time. This method is particularly suitable for working gate patterns of a mixed logic circuit including an SRAM area. It is expected that the pattern length reduction amount can be determined by selecting a mixture ratio of a mixed gas.

If the developed resist pattern widths have different values for the isolated and dense patterns, it is desired that the isolated pattern and dense pattern have different pattern length reduction amounts in order to finally form the patterns of the same length.

Each pattern width (gate length) reduction amount and a pattern width reduction amount difference between the isolated pattern and dense pattern were measured by using as parameters a time period of the over etching and the gas-flow-rate fraction of $O_2$ to $O_2+SO_2$ of the mixed gas.

Figure 3B:
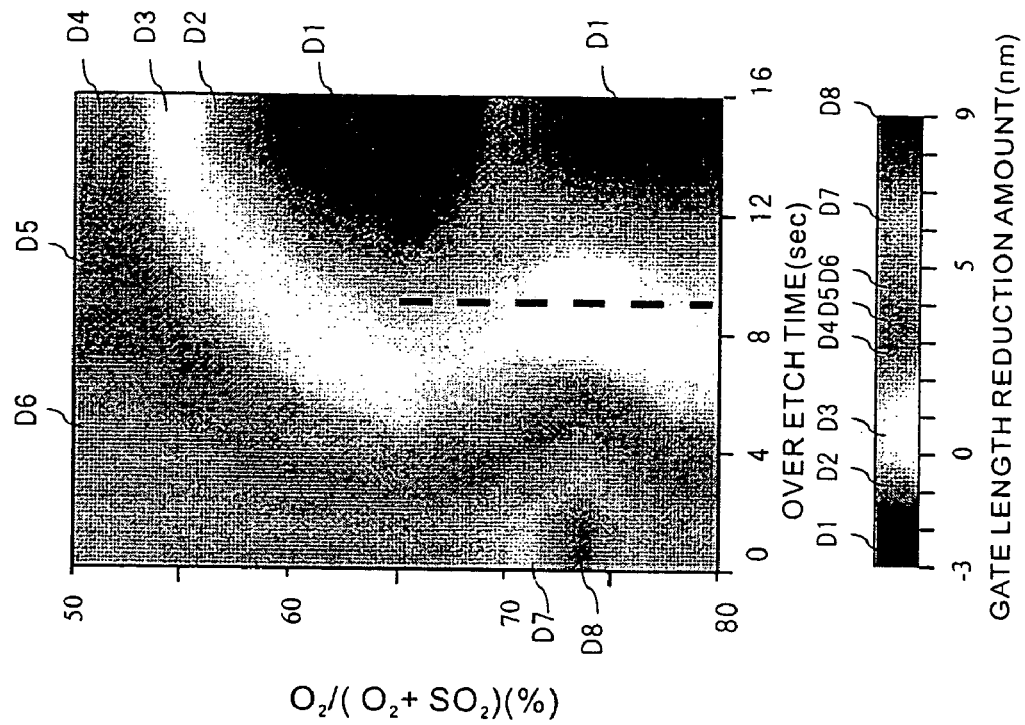
FIGS. 3A and 3B are distribution diagrams showing the experiment results.
Figure 3A:
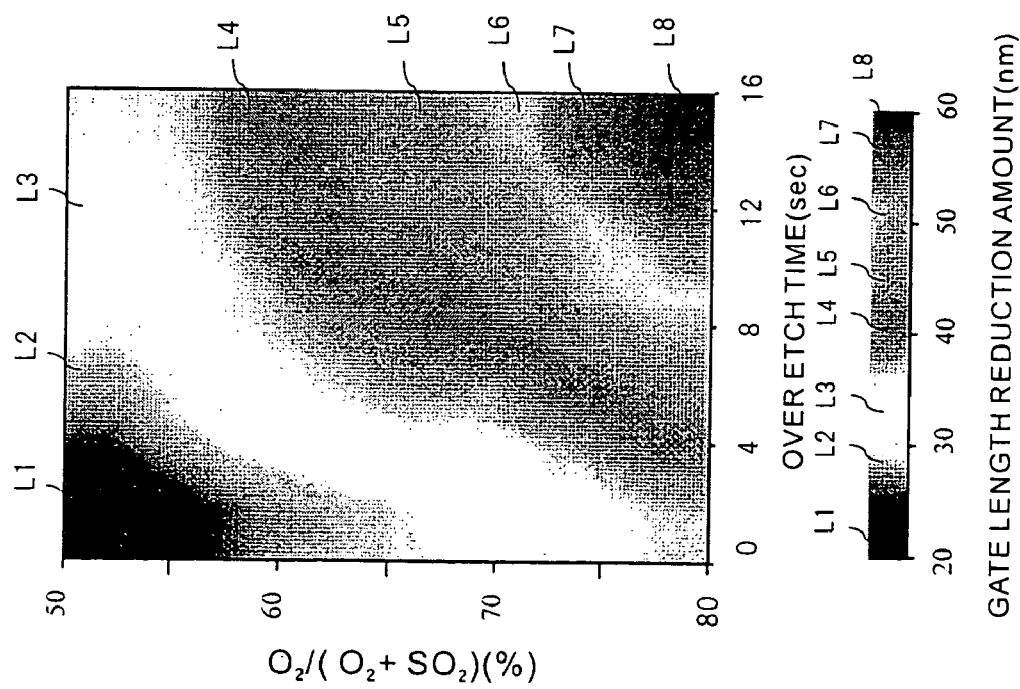

FIG. 3A is a graph showing the experiment results of checking how the gate length reduction amount of a dense pattern changes with a change in the over etching time and the $O_2$ gas-flow-rate fraction. In FIG. 3A, an upper left area L1 has the gate length reduction amount in the range of 20 nm to about 25 nm. A lower right area L8 has the gate length reduction amount in the range of about 58 nm to 60 nm. Areas L2, L3, L4, L5, L6 and L7 are stripe areas continuously distributed between the areas L1 and L8 and have the gate length reduction amounts gradually increasing their values.

As apparent from FIG. 3A, since each area has a spread of the over etching time and gas-flow-rate fraction, the same gate length reduction amount can be obtained by selecting the same area.

Similar to FIG. 3A, FIG. 3B is a graph showing the experiment results of checking the gate length reduction amount difference between the isolated pattern and dense pattern by using as parameters the over etching time and the $O_2$ gas-flow-rate fraction. In a right side area D1, the gate length reduction amount of the dense pattern is larger than that of the isolated pattern by 3 nm to about 1.5 nm.

In an area D2 surrounding the area D1, the gate length reduction amount of the dense pattern is larger than that of the isolated pattern by about 1.5 nm to about 0.3 nm.

An area D3 distributed broadly in a central area covers the area starting from that the gate length reduction amount difference is almost 0 to that the gate length reduction amount of the isolated pattern is larger than that of the dense pattern. In areas D4, D5, D6, D7 and D8, the gate length reduction amount of the isolated pattern gradually becomes larger than that of the dense pattern. The area D8 partially shown on the left side has the gate length reduction amount difference of near 9 nm.

An adjustment method of a mode I will be described in which the isolated and dense patterns have different resist pattern widths. Consider for example that polysilicon patterns having the same width of 47 nm are formed under the conditions that the isolated pattern has a resist pattern width of 84 nm and the dense pattern has a resist pattern width of 80 nm. A width to be trimmed is 37 nm for the isolated pattern and 33 nm for the dense pattern. A difference therebetween is 4 nm.

In FIG. 3(B), the area where the gate length reduction amount of the isolated pattern is larger than that of the dense pattern by 4 nm is approximately the border area between the areas D5 and D6. By using the over etching time and $O_2$ gas-flow-rate fraction in this border area, it becomes possible to obtain the gate length reduction amount of the isolated pattern larger than that of the dense pattern by about 4 nm.

In FIG. 3A, a central area of the area L3 slightly shifted to the area L4 has the gate length reduction amount of 33 nm for the dense pattern. By using the over etching time and $O_2$ gas-flow-rate fraction in this area, it becomes possible to obtain the gate length reduction amount of the desired 33 nm for the dense pattern.

An area is then determined, superposed on which area are the area in FIG. 3A satisfying the desired gate length reduction amount of the dense pattern and the area in FIG. 3B where the desired value of the gate length reduction amount difference between the isolated and dense patterns can be obtained. In this superposed area, both the isolated and dense patterns can obtain the desired gate length reduction amounts. If the superposed area includes a lot of suitable conditions, for example the shorter etching time is selected from the viewpoint of a production efficiency.

The desired etching conditions can be determined by changing the two parameters, the over etching time and the gas-flow-rate fraction.

Next, an adjustment method of a mode II will be described in which the isolated and dense patterns have the same resist pattern width. In FIG. 3B, a central area of the area D slightly shifted to the area D2 has the gate length reduction amount difference of almost 0 between the isolated and dense patterns. The etching under this condition can obtain the same gate reduction amount for both the isolated and dense patterns.

Namely, the resist pattern having the same width is formed for the isolated and dense patterns, and the condition that the isolated and dense patterns have the same gate length reduction amount is used so that the desired gate length can be formed.

In FIG. 3B, the condition indicated by a broken line is selected which sets the over etching time to 8.8 seconds. In this case, approximately the same gate length reduction amount can be obtained for the isolated and dense patterns.

FIG. 4 is a graph showing the experiment results in which experiments were conducted by changing the $O_2$ gas-flow-rate fraction under the above-described conditions, a straight line fitting plots was drawn, and an optimum recipe was obtained which indicates the relation between a desired gate length reduction amount y and an $O_2$ gas-flow-rate fraction X. In FIG. 4, plots indicated by a square show the experiment results and the straight line most properly approximating these plots is obtained. This straight line is given by:

$$y=0.5219 X+4.153$$

where X is the $O_2$ gas-flow-rate fraction and y is the gate length reduction amount.

Several gate length reduction amounts were selected, and the etching was performed at the corresponding $O_2$ gas-flow-rate fraction and the lengths of the obtained gates were measured. Plots indicated by a circle are these measurement results. The measurement results of samples 1 to 5 are very near to the straight line y, which indicates that this approximation is proper. Under the above-described conditions, polysilicon patterns can be obtained at an error of 1 nm or smaller at least in the gate length reduction amount range of 21 to 46 nm.

The adjustment method of the mode II has a fixed over etching time and selects only the $O_2$ gas-flow-rate fraction so that the control of this method is easy. If the isolated and dense patterns have different developed resist patterns, the mode II cannot be used and the mode I is used for the adjustment.

Figure 5:
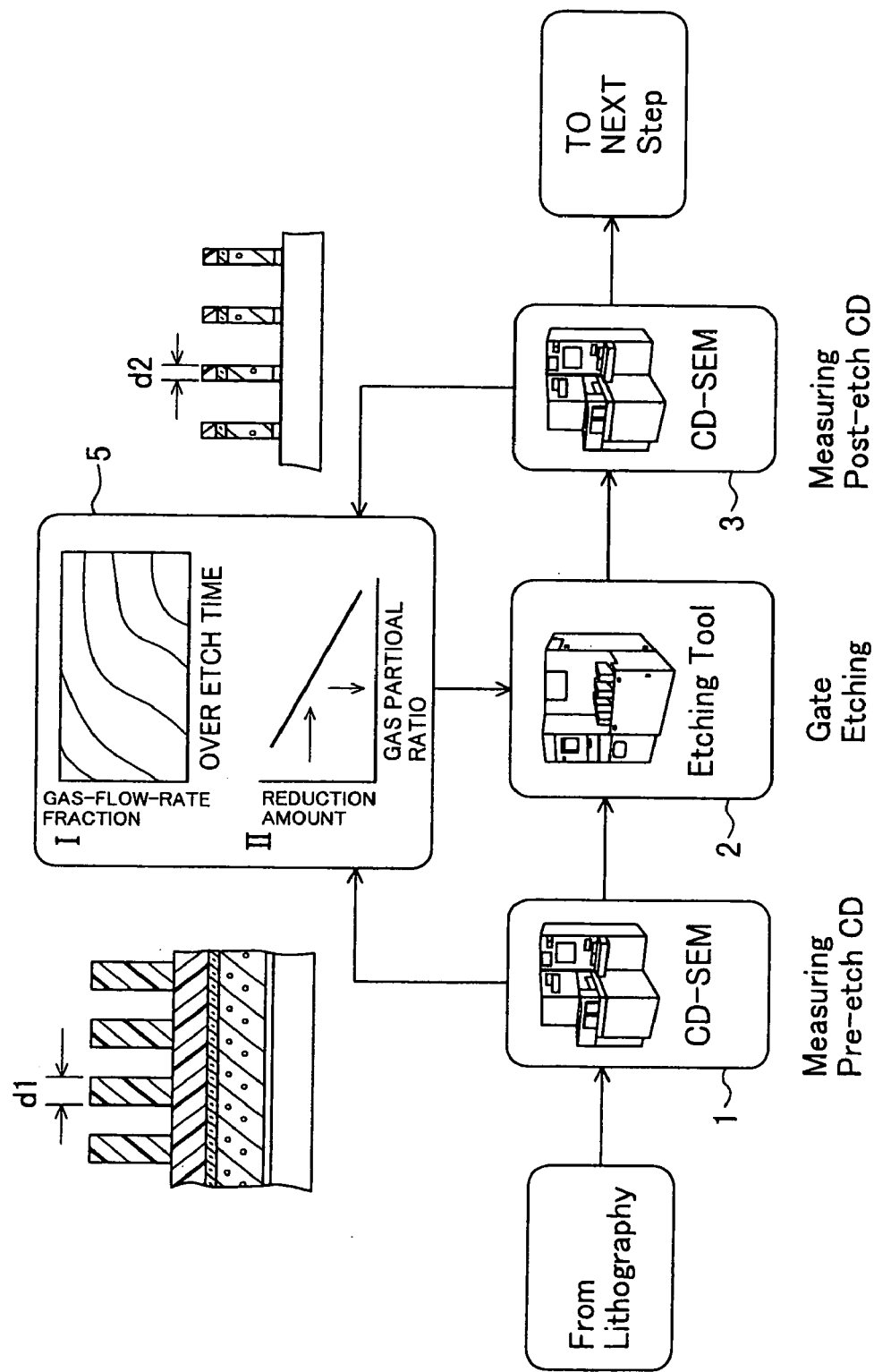
FIG. 5 is a block diagram showing the structure of an etching system.

FIG. 5 is a diagram showing an etching system based upon the knowing acquired from the above-described experiments. A measuring apparatus 1 is, for example, a scanning electron microscope (SEM) for measuring a micro size. The measuring apparatus 1 measures a resist pattern width and feeds forward the measurement results to a controller 5. An etching apparatus 2 etches a BARC layer under a resist pattern, a hard mask layer under the BARC layer, a polysilicon layer under the hard mask layer. The etching apparatus 2 can change the gas-flow-rate fraction of a mixed gas and adjust the etching time.

Figure 6:
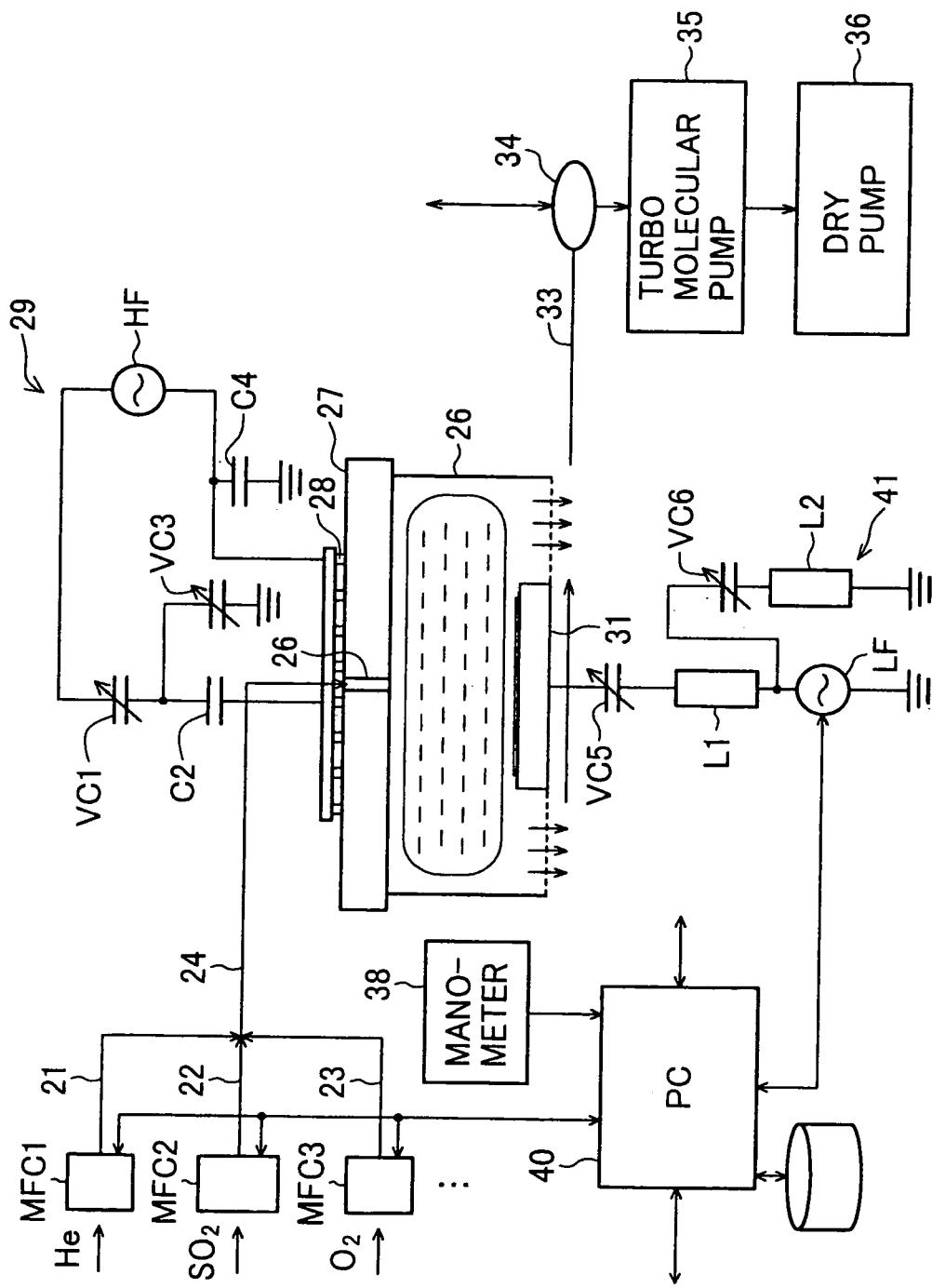
FIG. 6 is a block diagram showing an example of an etching apparatus.

FIG. 6 shows an example of the etching apparatus. Gas flow paths 21, 22 and 23 flow He, $SO_2$ and $O_2$, respectively and include mass flow controllers MFC1, MFC2 and MFC3, respectively. An optional number of other flow paths (not shown) having similar structures are also provided for flowing other gasses (e.g., HBr, $Cl_2$, $CF_4$, etc for etching a silicon oxide film and a polysilicon film). An etching chamber 26 is made of aluminum subjected to anodic oxidation, and has a diameter of 500 mm and a height of 230 mm for example. The top of the aluminum chamber is sealed with a quartz cover 27, and a helical coil 28 is provided on the quartz cover 27. The helical coil 25 has a rectangular cross section having a side of 12.5 mm, and 3.5 turns with a diameter of 330 mm.

The coil 28 is supplied with a high frequency power at a frequency of, for example, 27 MHz from a high frequency power unit 29. The high frequency power unit 29 has a high frequency power source HF, variable capacitors VC1 and VC3 and capacitors C2 and C4, and can automatically perform impedance matching.

The paths 21, 22 and 23 become confluent to a path 24 which passes through a through hole 26 in the quartz cover 27 to introduce an etching gas into the etching chamber. The etching chamber is connected to a turbo molecule pump 35 and a dry pump 36 via an exhaust pipe 33 and a valve 34.

A susceptor 31 is mounted on the bottom of the etching chamber 26 and places thereon a work target (wafer). The susceptor 31 is connected to a high frequency bias power unit 41. The high frequency bias power unit 41 includes a high frequency power source LF having a relatively low frequency of 2 MHz, variable capacitors VC5 and VC6 and inductors L1 and L2, and can automatically perform impedance matching.

A vacuum degree in the etching chamber 26 is monitored with a manometer 38, and the measurement result is sent to a control circuit 40. The control circuit 40 supplies control signals to the high frequency power units 29 and 41, mass flow controllers MFC1, MFC2 and MFC4, valve 34 and the like.

Reverting to FIG. 5, a measuring apparatus 3 is an SEM capable of measuring a micro size similar to the measuring apparatus 1. The measuring apparatus 3 may be replaced by the measuring apparatus 1. The measuring apparatus 3 measures the polysilicon pattern length after etching and feeds back the measurement results to the controller 5.

A resist pattern width of each wafer in a test element group to be etched is first measured with the measuring apparatus 1. The measuring apparatus 1 feeds forward the measurement results to the controller 5. Upon reception of the resist pattern width from the measuring apparatus 1, the controller 5 determines the etching conditions to realize a preset pattern length, and supplies the etching conditions to the control circuit 40 of the etching apparatus 2.

In the mode I, both the etching time and gas-flow-rate fraction are used as variables and determined so as to realize a desired etching process. In the mode II, the over etching time is fixed so that the gas-flow-rate fraction is determined so as to realize a desired etching process.

The etching apparatus 2 performs etching under the supplied etching conditions. The measuring apparatus 3 measures the polysilicon pattern length after etching and feeds the measurement results back to the controller 5. If the conditions of the etching apparatus change after a long term use and there is any displacement from a desired gate length, the controller 5 corrects data in accordance with the measurement results of the pattern length after etching. For the succeeding etching, the etching conditions are determined from the corrected data so that a desired result can be obtained.

The above-described control does not operate properly if a length difference between the isolated and dense patterns is too large. In this case, the succeeding control becomes easy if the length of one of the isolated and dense patterns can be adjusted.

Figure 7:
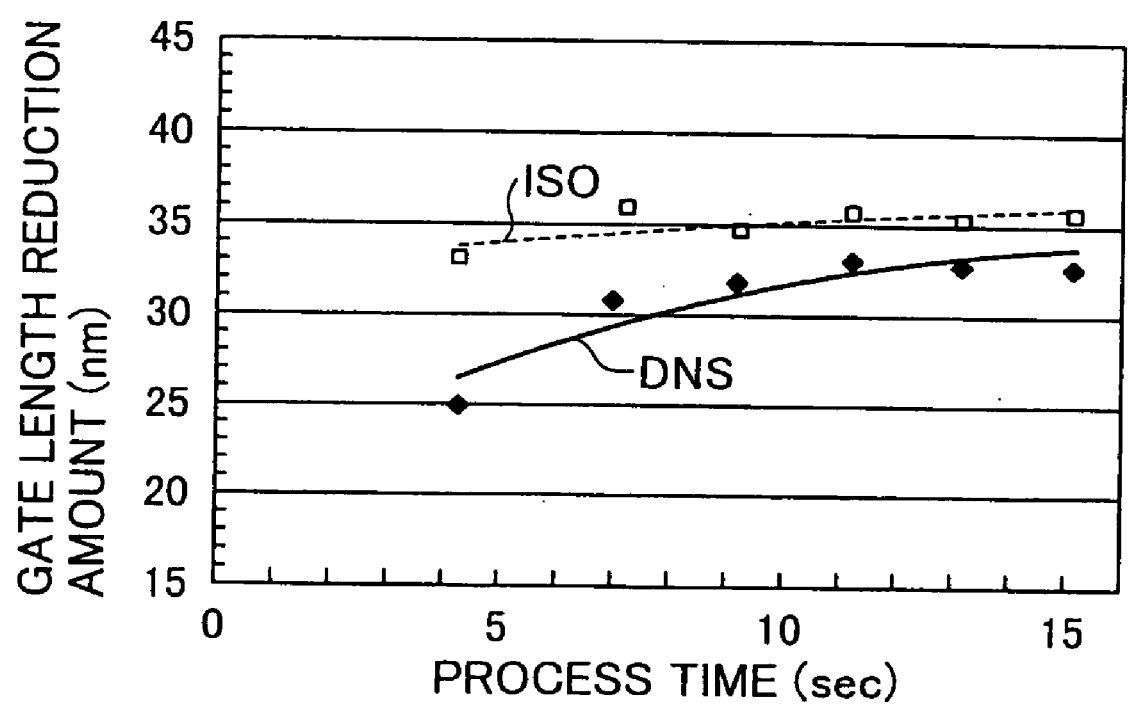
FIG. 7 is a graph illustrating another control method.

FIG. 7 is a graph showing a change in a resist pattern length when the resist pattern is processed by He gas at 40 mtorr. Although the length reduction amount of the isolated pattern ISO changes hardly, the length reduction amount of the dense pattern DNS increases as the process time prolongs. By using a combination of the above-described adjustment and the resist pattern width adjustment for one of the isolated and dense patterns shown in FIG. 7, the length reduction amount difference between the isolated and dense patterns can be introduced into the easy-to-control range so that a desired adjustment becomes possible.

In the above-description, the $O_2$ gas-flow-rate fraction (=[$O_2$]/([$SO_2$]=[$O_2$]) where [ ] indicates a flow rate) and the over etching time are mainly used as the control variables. The etching gas essentially consists of the $O_2$ gas for mainly enhancing etching, the $SO_2$ gas for mainly suppressing etching, and the inert He gas which is unable to chemically react with the work target. In the above-description, the He dilution ratio (=[He]/[total flow rate]) is made constant. The He dilution ratio may be used as the control variable. How the gate length reduction amount changes with the He dilution ratio was checked.

Figures 8A, 8B:
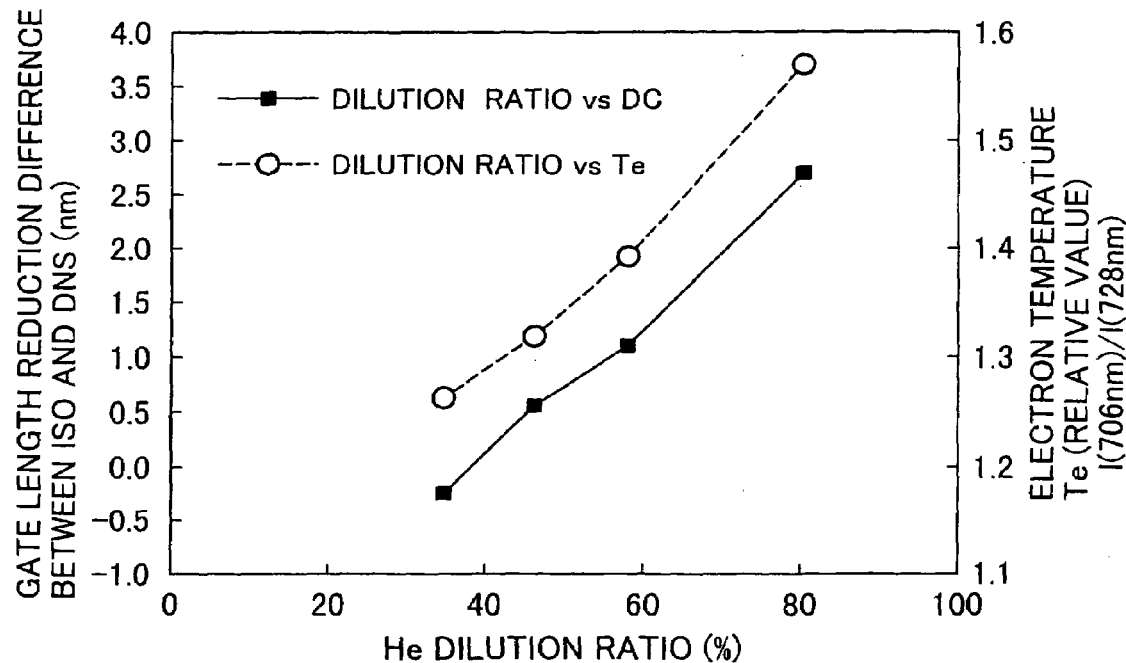
FIGS. 8A and 8B are a table and a graph showing the experiment results of a change in a gate length reduction amount when an inert gas dilution ratio is changed.

FIGS. 8A and 8B are a table and a graph showing the experiment conditions and results. FIG. 8A shows the experiment results. Mixture gas of He, $SO_2$, and $O_2$ was used as the etching gas, and the He dilution ratio was changed to four values, 34%, 46%, 57% and 80%. The total flow rate was made constant at 87 sccm, and the $SO_2$ gas-flow-rate fraction was made constant at 26%. The following description is made by using the $SO_2$ gas-flow-rate fraction instead of the $O_2$ gas-flow-rate fraction. The pressure in the plasma processing chamber is 5 mtorr, the plasma generation high frequency power is 300 W and the bias voltage is 100 Vpp. The gate length reduction amounts of the isolated and dense patterns and the electron temperature were measured. The electron temperature was estimated from an intensity ratio between an optical emission intensity at the wavelength of 706 nm of an He atom and that at the wavelength of 728 nm.

FIG. 8B is the graph showing the experiment results. The abscissa represents an He dilution ratio in the unit of % and the ordinate represents a gate length reduction amount difference between the isolated and dense patterns in the unit of nm. The electron temperature Te is represented by a relative value of the He optical emission intensity I (706 nm) at the wavelength of 706 nm relative to the He optical emission intensity I (728 nm) at the wavelength of 728 nm. It can be seen that as the He dilution ratio increases, the gate length reduction amount difference between the isolated and dense patterns increases almost linearly. This indicates the possibility that the He dilution ratio can be used as a suitable variable for etching control. It is expected that the electron temperature can be used instead of the He dilution ratio. For example, a similar change can be expected by a pressure change.

FIG. 3A indicates that the trimming amount can be controlled by the function of the $O_2$ gas-flow-rate fraction and over etching time. A change in the trimming amount shows a rather complicated mode relative to the over etching time. It has been found that the trimming amount by etching can be controlled by changing the dilution ratio of inert gas such as He and Ne. This has been studied more in detail.

FIG. 9 is a table schematically showing the structure of samples under experiments. The He dilution ratio was changed to five values, 50, 60, 70, 80 and 90 (%) and the $SO_2$ gas-flow-rate fraction was changed to five values, 15.47, 20.62, 25.32, 29.72 and 34.91 (%). As shown in the table, these twenty five samples are represented by S11, . . . , S15, . . . , S51, . . . , S55, and sample groups with a constant dilution ratio and different $SO_2$ gas-flow-rate fraction are represented by VF1, VF2, VF3, VF4 and VF5. Sample groups with a constant $SO_2$ gas-flow-rate fraction and different He dilution ratios are represented by VD1, VD2, VD3, VD4 and VD5. The total etching gas flow rate was fixed to 130.5 sccm for all samples and the over etching time was fixed to 50%. Each sample has isolated and dense patterns.

Figure 10:
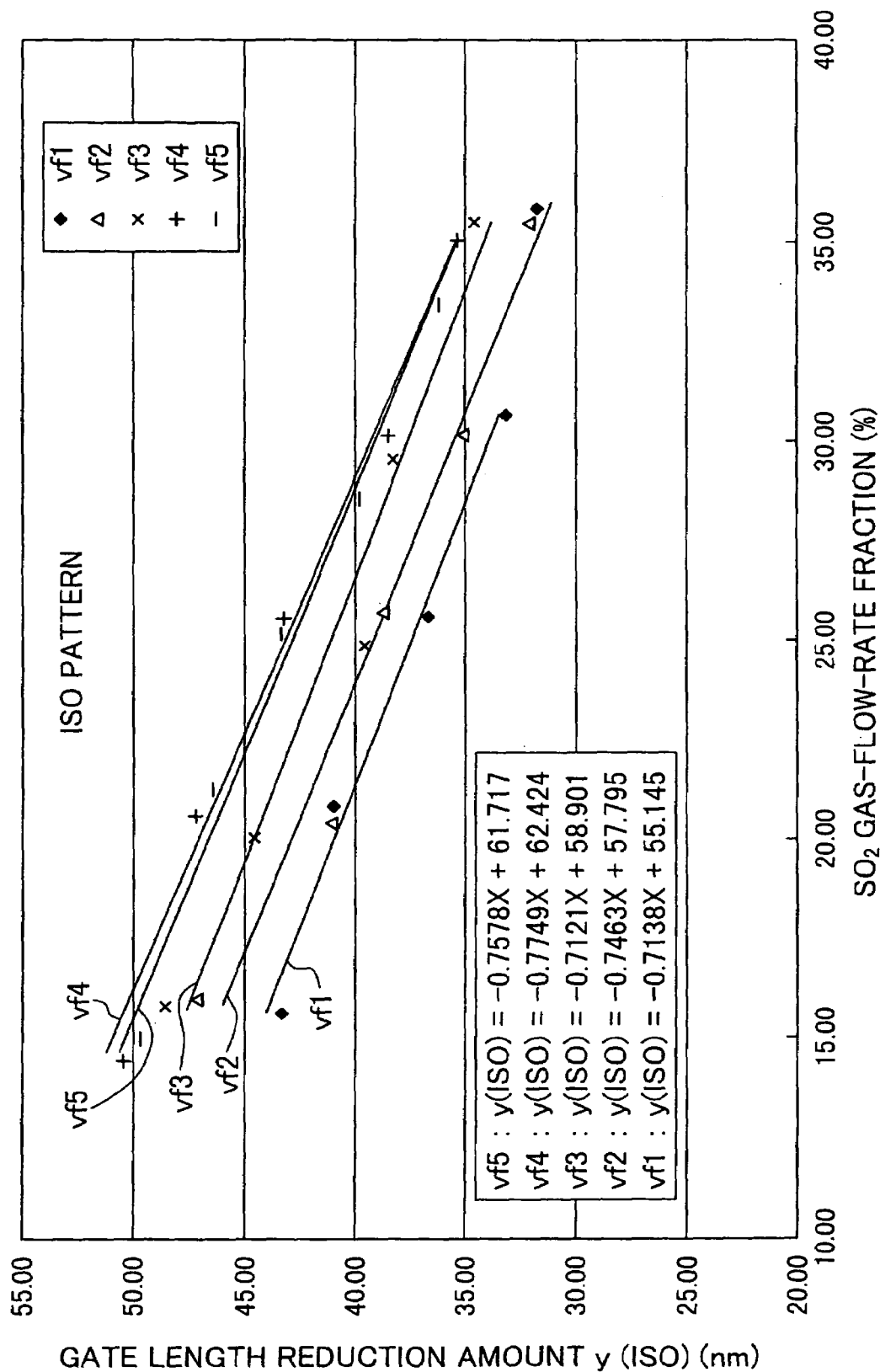
FIG. 10 is a graph showing the experiment results of a change in a gate length reduction amount when an $SO_2$ gas-flow-rate fraction is changed for isolated patterns.

FIG. 10 is a graph showing the measurement results of checking how the gate length reduction amount y (ISO) of the isolated pattern changes with the $SO_2$ gas-flow-rate fraction X. The abscissa represents an $SO_2$ gas-flow-rate fraction in the unit of % and the ordinate represents a gate length reduction amount in the unit of nm. The measurement results of the sample group VF1 are indicated by rhomboid plots and a straight line approximating these points is represented by vf1. Similarly, the measurement results ∆ of the sample group VF2 are approximated by a straight line vf2, the measurement results×of the sample group VF3 are approximated by a straight line vf3, the measurement results+of the sample group VF4 are approximated by a straight line vf4, and the measurement results−of the sample group VF5 are approximated by a straight line vf5. In all the sample groups, as the $SO_2$ gas-flow-rate fraction X is increased, the gate length reduction amount reduces approximately linearly and its slope is generally equal. Although the characteristics vf1 to vf4 change almost regularly, the characteristic vf5 saturates. In this graph, the formulas of the approximated straight lines are shown.

Figure 11:
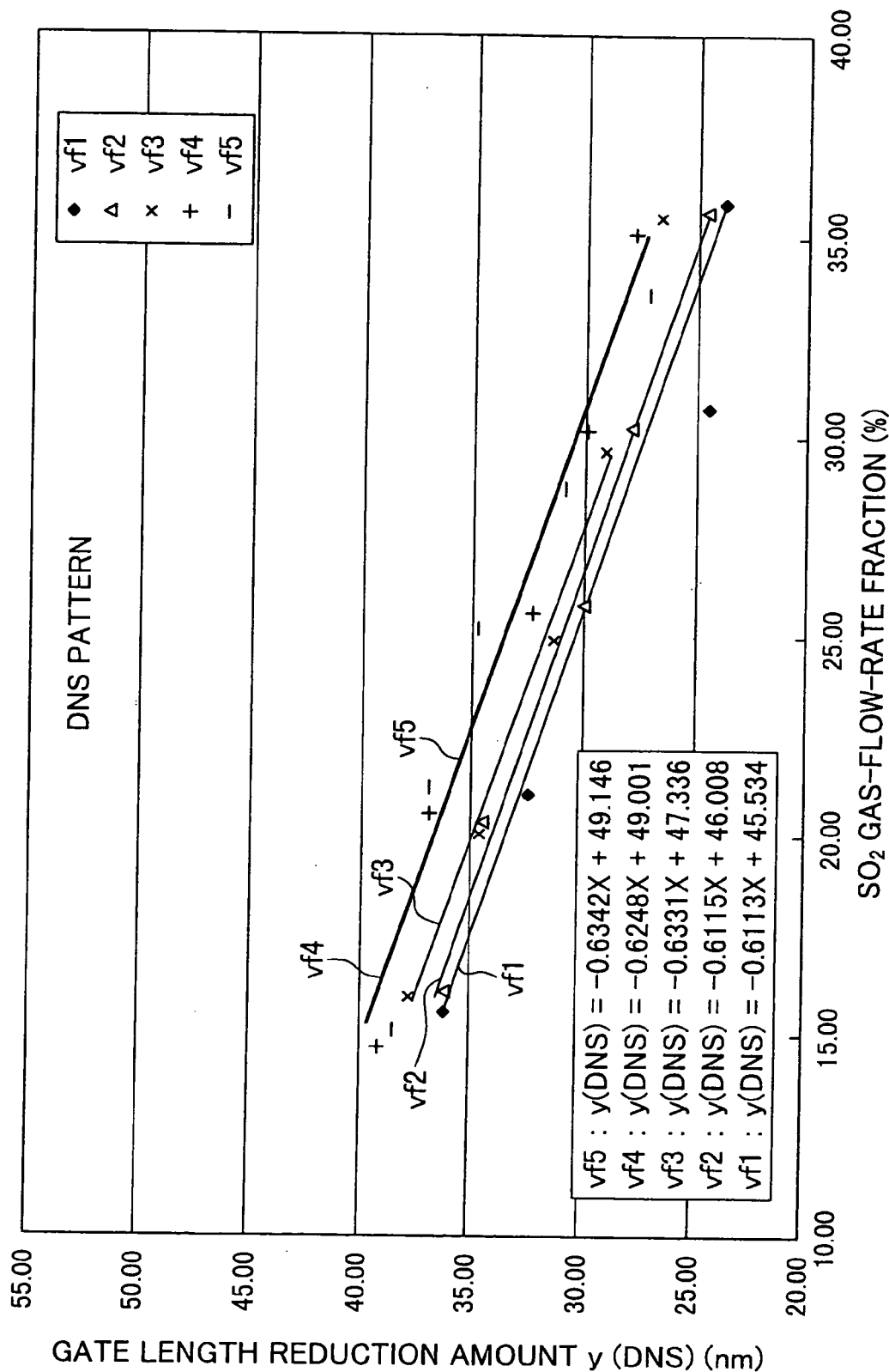
FIG. 11 is a graph showing the experiment results of a change in a gate length reduction amount when the $SO_2$ gas-flow-rate fraction is changed for dense patterns.

FIG. 11 is a graph showing the measurement results of the gate length reduction amount y (DNS) of the dense pattern.

In all the sample groups, as the $SO_2$ gas-flow-rate fraction X is increased, the gate length reduction amount reduces approximately linearly. Although the characteristics vf1 to vf4 of the sample groups VF1 to VF4 change almost regularly, the characteristic vf5 of the sample group VF5 saturates. The slope of the reduction in the gate length reduction amount y (DNS) relative to an increase in the $SO_2$ gas-flow-rate fraction X is gentler than the isolated pattern and the change amount relative to a change in the dilution ratio is small. Similar to FIG. 10, the formulas of the approximated straight lines are shown in this graph.

In FIG. 4, the trimming amount increases generally linearly as the $O_2$ gas-flow-rate fraction increases. In FIGS. 10 and 11, a slope of the change is in an opposite direction because the $SO_2$ gas-flow-rate fraction is used instead of the $O_2$ gas-flow-rate fraction.

Figure 12:
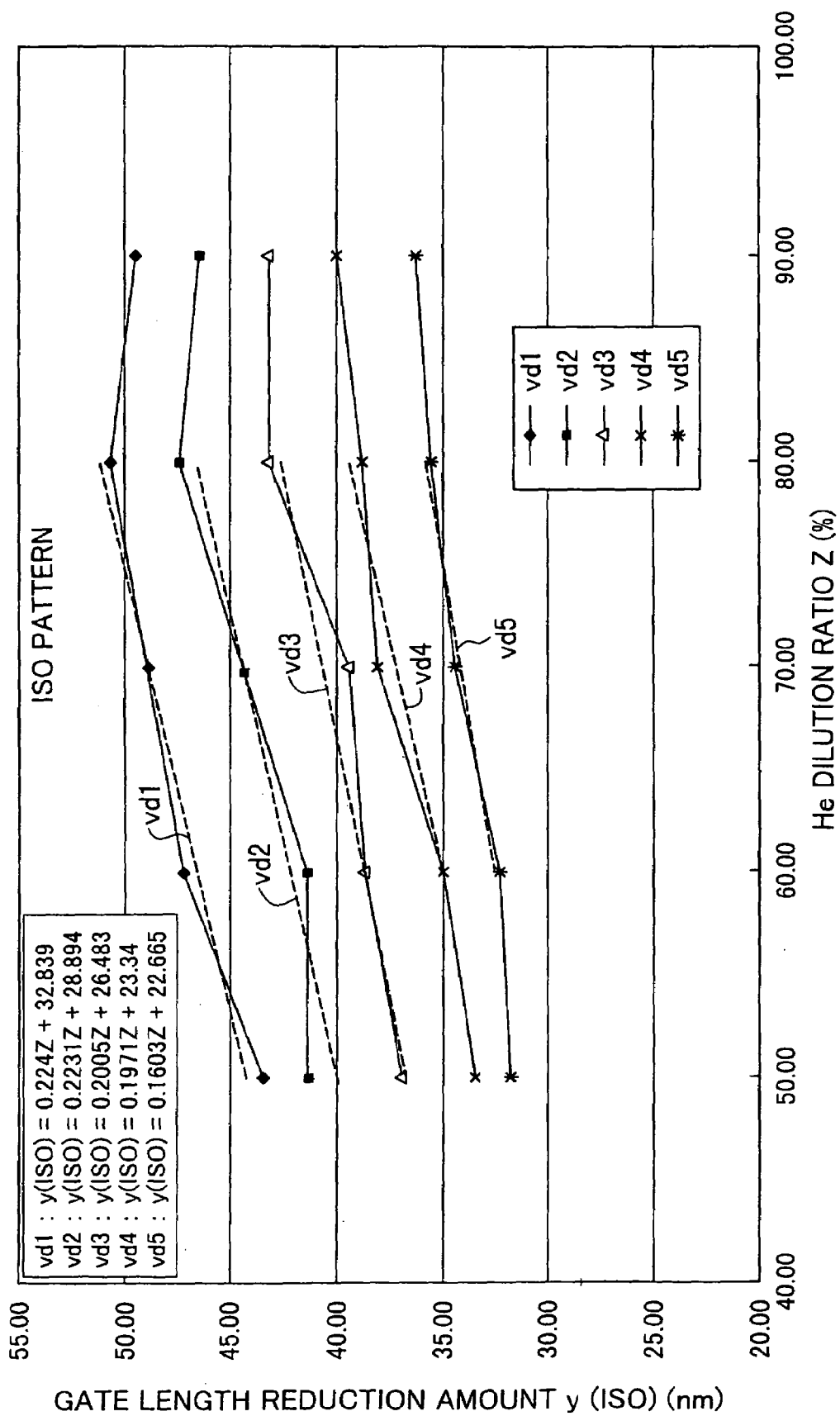
FIG. 12 is a graph showing the experiment results of a change in a gate length reduction amount when an He dilution ratio is changed for isolated patterns.

FIG. 12 is a graph showing the gate length reduction amount y (ISO) of the isolated pattern as a function of an He dilution ratio Z. The abscissa represents an He dilution ratio Z in the unit of %, and the ordinate represents a gate length reduction amount y (ISO) of the isolated pattern. The characteristics vd1 to vd5 correspond to sample groups VD1 to VD5. It appears that the characteristics change particularly at the He dilution ratio Z=90%. Regular characteristics appear in the He dilution ratio range Z=50 to 80%, particularly in the range of 60 to 80%.

Figure 13:
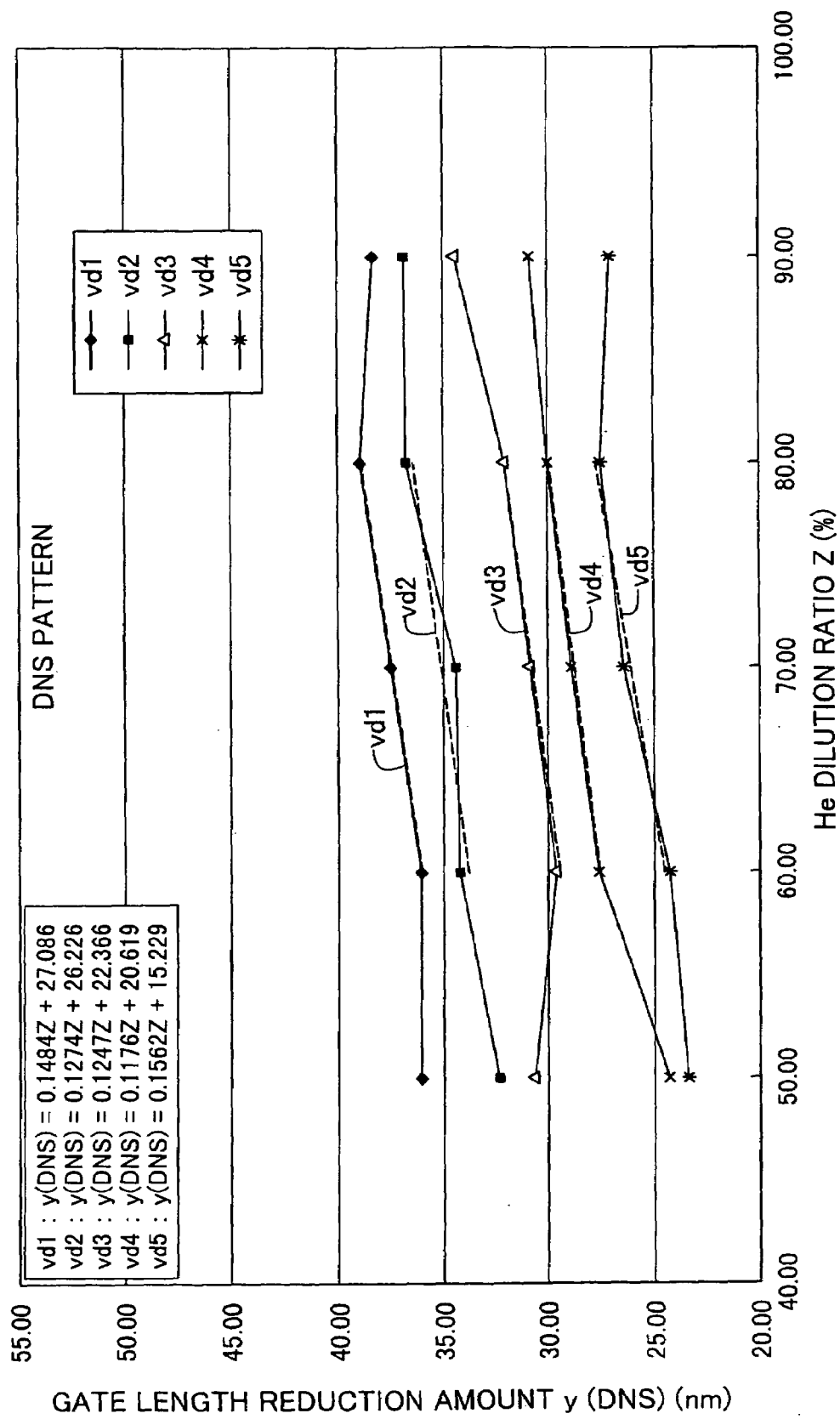
FIG. 13 is a graph showing the experiment results of a change in a gate length reduction amount when an He dilution ratio is changed for dense patterns.

FIG. 13 is a graph showing a change in the gate length reduction amount y (DNS) of the dense pattern relative to a change in the He dilution ratio Z. Similar to FIG. 12, it appears that the characteristics change at the He dilution rate Z=90%. Regular characteristics can be observed in the He dilution ratio range Z=50 to 80%, particularly in the range of 60 to 80%.

As shown in FIGS. 10 to 13, by controlling the $SO_2$ gas-flow-rate fraction X and He dilution ratio Z, it can be expected that a desired gate length reduction amount can be obtained for both the isolated and dense patterns. The procedure of obtaining a desired gate length reduction amount will be described in detail hereinafter.

Figures 14A, 14B, 14C, 14D:
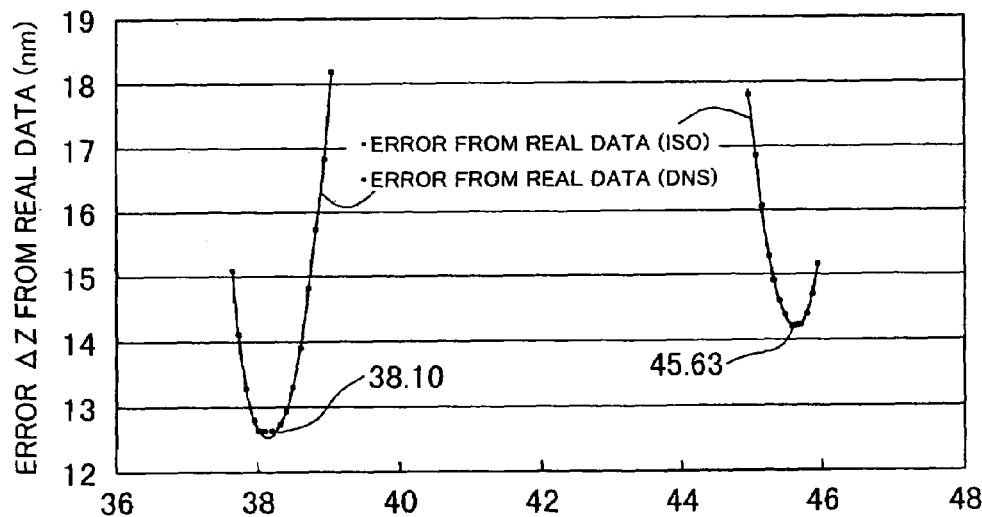
FIGS. 14A to 14D are tables, a graph and equations illustrating the procedure of transforming the experiment results shown in FIGS. 10 to 13 into the equations.

FIG. 14A is a table showing a set of characteristics of the gate length reduction amount obtained by controlling the $SO_2$ gas-flow-rate fraction X. The ISO column shows a slope of the gate length reduction amount of the isolated pattern relative to the $SO_2$ gas-flow-rate fraction X, and the DNS column shows a slope of the gate length reduction amount of the dense pattern relative to the $SO_2$ gas-flow-rate fraction X. The slope value is obtained by approximating the values of the five sample groups. An average value is 0.741 for the isolated pattern and 0.623 for the dense pattern. By using this average value, all samples can be processed by the same formula.

FIG. 14B is a table showing a set of slopes of the gate length reduction amount obtained by controlling the He dilution ratio. The ISO column shows a slope of the gate length reduction amount of the isolated pattern relative to the He dilution ratio, and the DNS column shows a slope of the gate length reduction amount of the dense pattern relative to the He dilution ratio. These values are also obtained by approximating the values of the five sample groups, and the average values thereof are 0.201 and 0.135.

FIG. 14C shows the values of a constant term of the function of the $SO_2$ gas-flow-rate fraction X and He dilution ratio Z indicating the gate length reduction amount y. As an error of real data is calculated from a formula without the constant term, the minimum error value of the isolated pattern is 45.63 and that of the dense pattern is 38.10. These values can therefore be adopted as the constant terms.

FIG. 14D shows the formulas indicating the gate length reduction amount y (ISO) of the isolated pattern and the gate length reduction amount y (DNS) of the dense pattern as the function of the $SO_2$ gas-flow-rate fraction X and He dilution ratio Z.

$$y(ISO) = -0.741\ X + 0.201\ Z + 45.63 \quad (1)$$

$$y(DNS) = -0.623\ X + 0.135\ Z + 38.10 \quad (2)$$

Two quadratic equations are obtained by giving a desired isolated pattern gate length reduction amount y (ISO) and a desired dense pattern gate length reduction amount y (DNS). By solving these simultaneous equations, solutions for the variables X and Z can be obtained.

FIG. 15A is a solid graph expressing stepwise the equation (1) of the gate length reduction amount y (ISO) of the isolated pattern. The gate length reduction amount reduces linearly as the $SO_2$ gas-flow-rate fraction increases, and increases linearly as the He dilution ratio increases.

FIG. 15B is a solid graph showing an error δy (ISO) between a real gate length reduction amount and a gate length reduction amount obtained by the single equation (1): y(ISO)=−0.741 X+0.201 Z+45.63, relative to the $SO_2$ gas-flow-rate fraction X and He dilution ratio Z.

FIG. 15C is a table showing a set of errors.

Similar to FIG. 15A, FIG. 16A is a solid graph showing the gate length reduction amount y (DNS) of the dense pattern as the function of the $SO_2$ gas-flow-rate fraction and He dilution ratio. The gate length reduction amount reduces linearly as the $SO_2$ gas-flow-rate fraction increases, and increases linearly as the He dilution ratio increases. A change rate is gentler than that of the isolated pattern.

Similar to FIG. 15B, FIG. 16B is a solid graph showing an error δy (DNS) between a real gate length reduction amount and a gate length reduction amount obtained by the single equation (2): y(DNS)=−0.623 X+0.135 Z+38.10, as the function of the $SO_2$ gas-flow-rate fraction X and He dilution ratio Z.

FIG. 16C is a table showing a summary of errors shown in FIG. 16B.

If the gate length reduction amounts of the isolated and dense patterns are each approximated by a single linear expression, how the $SO_2$ gas-flow-rate fraction X and He dilution ratio Z are selected can be easily determined analytically to obtain desired gate length reduction amounts. The $SO_2$ gas-flow-rate fraction X and He dilution ratio Z for realizing desired gate length reduction amounts can be obtained by solving the simultaneous equations shown in FIG. 14D using a desired isolated pattern gate length reduction amount y (ISO) and a desired dense pattern gate length reduction amount y (DNS). However, if the amounts are each approximated by a single linear expression, errors occur as shown in FIGS. 15B and 15C and FIGS. 16B and 16C. After X and Z are obtained once analytically, the obtained solutions can be further corrected by considering the errors from real data.

There is the case that it is more convenient to use the gate length reduction amount difference between the isolated and dense patterns and one of the gate length reduction amounts, that using the gate length reduction amounts of the isolated and dense patterns.

Figures 17A, 17B:
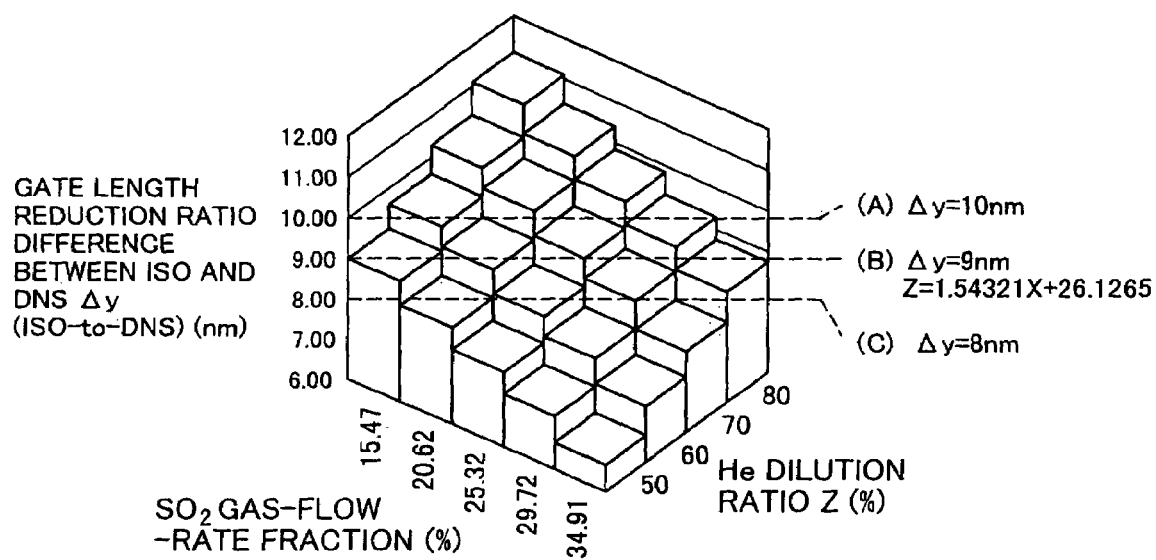
FIGS. 17A and 17B are a solid graph and a table showing the relation of a gate length reduction amount difference between isolated and dense patterns and the $SO_2$ gas-flow-rate fraction X and He dilution ratio Z.

FIG. 17A is a solid graph showing stepwise a change in a gate length reduction amount difference Δy (ISO-to-DNS) between the isolated and dense patterns, obtained by subtracting a value shown in FIG. 16A from a value shown in FIG. 15A, relative to the $SO_2$ gas-flow-rate fraction and He dilution ratio Z. Broken lines A, B and C shown in FIG. 17A are straight lines for the gate length reduction amount differences between the isolated and dense patterns of 10 nm, 9 nm and 8 nm, respectively. For example, the characteristic of the broken line B can be expressed by:

$$Z=1.54321\,X+26.1265 \quad (3)$$

The equations of the relation between X and Z of the other gate length reduction amount differences between the isolated and dense patterns can be obtained similarly. As this equation is substituted into the equation (1) or (2), X or Z can be obtained. As the result is substituted in the equation (3), the remaining Z or X can be obtained.

FIG. 18 is a recipe table showing the $SO_2$ gas-flow-rate fraction and He dilution ratios to be used when a desired gate length reduction amount of the dense pattern is obtained at the gate length reduction amount difference between the isolated and dense patterns of 9 nm.

In this manner, the $SO_2$ gas-flow-rate fraction X and He dilution ratio Z realizing a desired gate length reduction amount can be obtained by obtaining the gate length reduction amount difference between the isolated and dense patterns and using the equation of the He dilution ratio Z and $SO_2$ gas-flow-rate fraction at this gate length reduction amount difference and the equation of the He dilution ratio Z and $SO_2$ gas-flow-rate fraction for one of the isolated and dense patterns. After X and Z are obtained once, correction can be made by considering errors, similar to the above-described case. As the gas not chemically reacting with a work target layer, another inert gas such as Ne may be used in addition to He.

Figure 19:
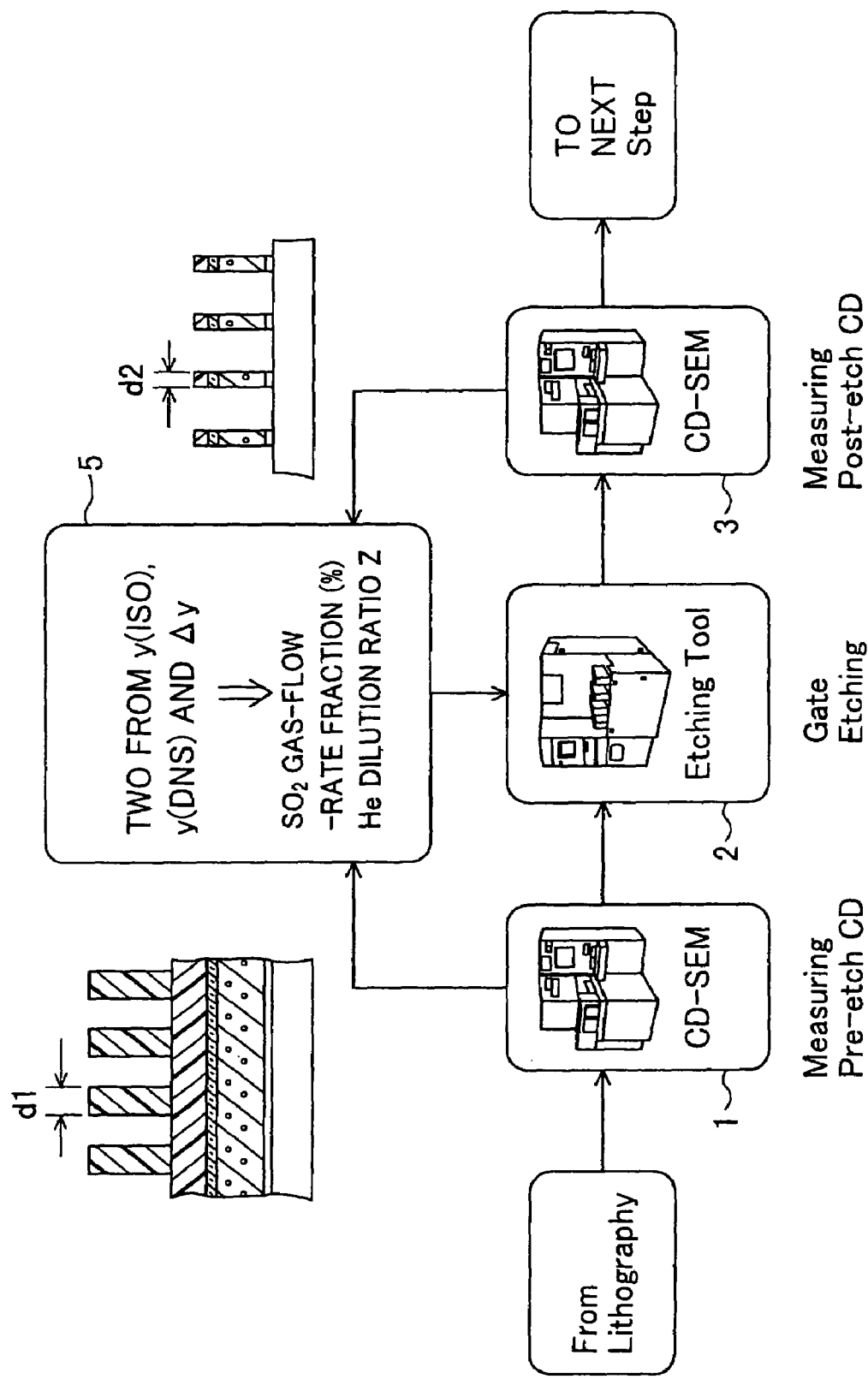
FIG. 19 is a block diagram showing the structure of another etching system.

FIG. 19 is a block diagram showing the structure of an etching system using the above-described control method. Measuring apparatuses 1 and 3 and an etching apparatus 2 have similar structures to those shown in FIG. 5. A controller 5 obtains the $SO_2$ gas-flow-rate fraction X and He dilution ratio Z realizing desired gate length reduction amounts by using any of the methods described above and two of a desired isolated pattern gate length reduction amount y (ISO), a desired dense pattern gate length reduction amount y (DNS) and a desired gate length amount difference Δy between the isolated and dense patterns. In accordance with the obtained results, the controller controls the etching apparatus 2. Other points are similar to the etching system shown in FIG. 5.

The layouts of semiconductor integrated circuit devices vary one after another depending on the product type. If the layouts are very different, a slope of a change in the gate length reduction amount relative to a change in the $SO_2$ gas-flow-rate fraction and He dilution ratio changes. In order to retain a desired adjustment range, it is desired in some cases to control the adjustment range by using other parameters. In addition to the $SO_2$ gas-flow-rate fraction ($O_2$ partial ratio) and inert gas dilution ratio, the over etching time and a total gas flow rate (gas-flow-rate fraction) may be used as the etching parameters.

Figure 20A:
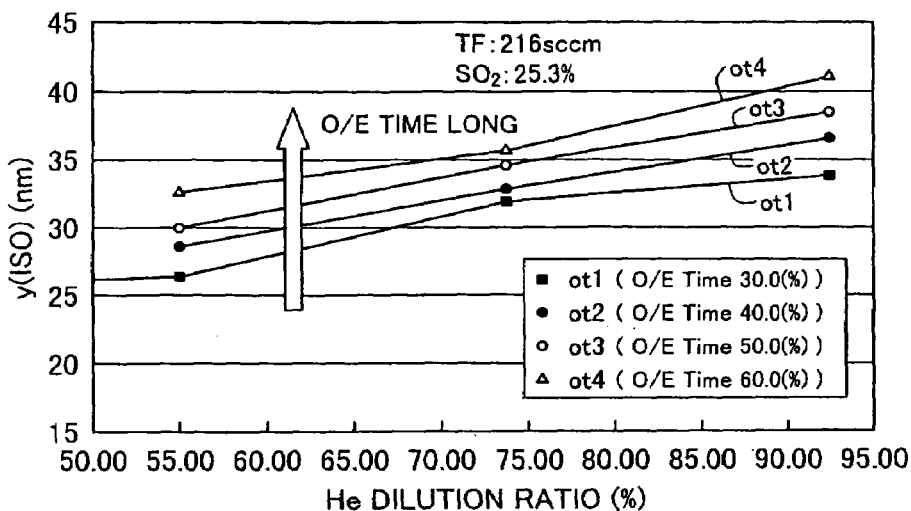
FIGS. 20A to 20C are graphs showing the experiment results of a change in a gate length reduction amount when an over etch time is changed.

FIG. 20A is a graph showing how the gate length reduction amount y (ISO) of the isolated pattern relative to the He dilution ratio changes when the over etching time is changed. As the over etching time is prolonged, there is the tendency that the gate length reduction amount increases as a whole. The total gas flow rate TF is fixed to 216 sccm and the $SO_2$ gas-flow-rate fraction is fixed to 23.5%.

Figure 20B:
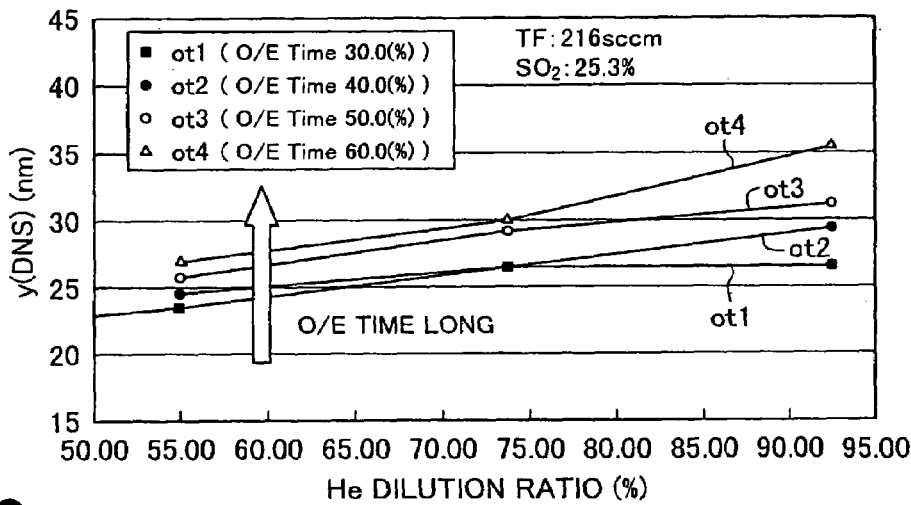

FIG. 20B is a graph showing a change in the gate length reduction amount y (DNS) of the dense pattern relative to a change in the He dilution ratio when the over etching time is changed. As the over etching time is prolonged, there is the tendency that the gate length reduction amount increases. However, it cannot be said that this change is very regular.

Figure 20C:
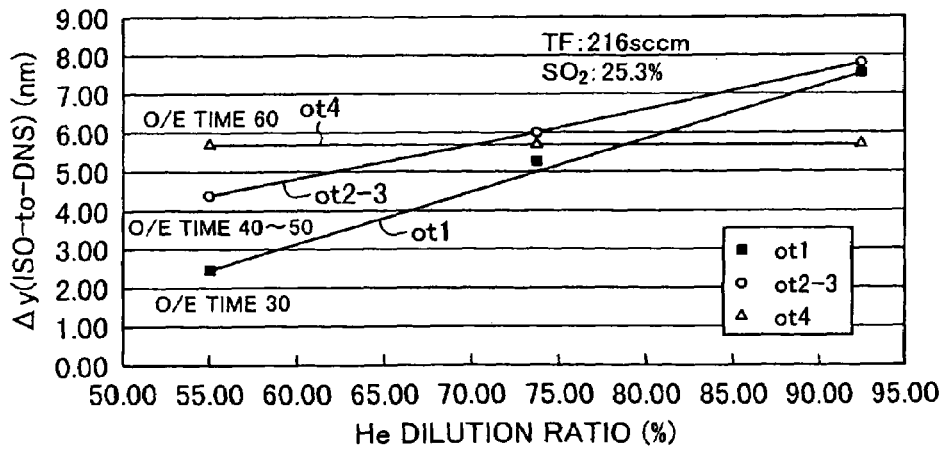

FIG. 20C is a graph showing a change in the gate length reduction amount difference Δy relative to a change in the He dilution ratio when the over etching time is changed. In the over etching range of 30 to 50%, as the over etching time is prolonged, there is the tendency that the gate length reduction amount difference between the isolated and dense patterns increases. However, at the over etching time of 60%, a slope of the gate length reduction amount difference relative to the He dilution ratio disappears.

As shown in FIGS. 20A, 20B and 20C, by changing the over etching time, the etching mode can be changed. It is however preferable that the adjustment is performed by limiting the adjustment range. If the over etching time is changed in excess of the proper adjustment range, an unexpected phenomenon may occur.

Figure 21A:
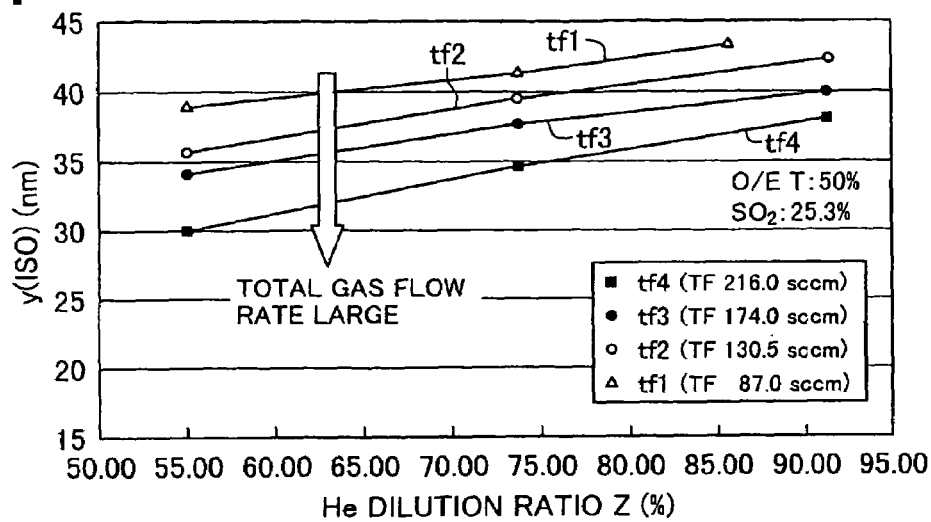
FIGS. 21A to 21C are graphs showing the experiment results of a change in a gate length reduction amount when a total gas flow rate is changed.

FIG. 21A is a graph showing how the gate length reduction amount y (ISO) of the isolated pattern relative to the He dilution ratio changes when the total gas flow rate is changed. As the total gas flow rate is increased, there is the tendency that the gate length reduction amount y (ISO) of the isolated pattern reduces.

Figure 21B:
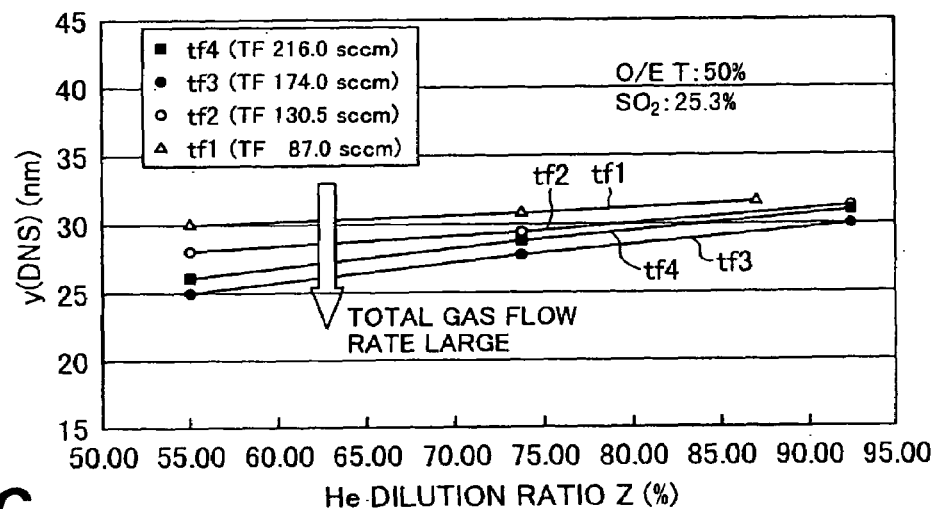

FIG. 21B is a graph showing how the gate length reduction amount y (DNS) of the dense pattern relative to the He dilution ratio changes when the total gas flow rate increased. As the total gas flow rate is increased, there is the tendency that the gate length reduction amount y (DNS) of the dense pattern reduces. A change in the gate length reduction amount y (DNS) of the dense pattern is smaller than a change in the gate length reduction amount of the isolated pattern, and it cannot be said that the change is very regular. Particularly at the total gas flow rate of 216 sccm, the change becomes larger than at the total flow rate of 174 sccm.

Figure 21C:
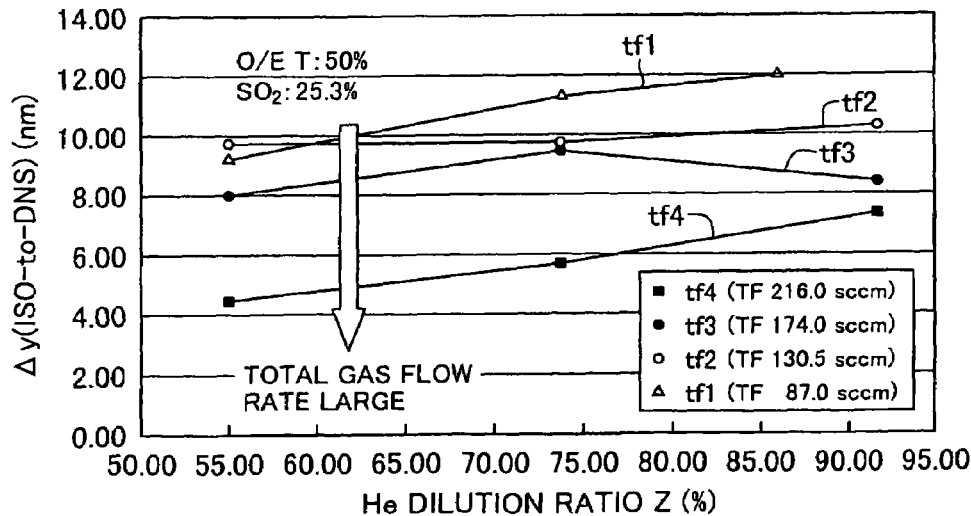

FIG. 21C is a graph showing how the gate length reduction amount difference Δy between the isolated and dense patterns relative to the He dilution ratio changes with a change in the total gas flow rate. As the total gas flow rate is increased, the gate length reduction amount difference between the isolated and dense patterns reduces.

As shown in FIGS. 20A, 20B and 20C and FIGS. 21A, 21B and 21C, at least one of the over etching time and total gas flow rate can be adopted as an auxiliary parameter to be used for changing the adjustment range or the like.

The etching performance of the etching apparatus has the tendency that it changes with a lapse of the etching time. As the product type of a target semiconductor integrated circuit changes, the etching characteristic also changes in some cases. Description will be made on an etching process adopting a pilot wafer for dealing with such changes.

FIG. 22 is a flow chart illustrating an etching method using a pilot wafer. At Step S11, the pattern widths of a wafer group (lot) formed with resist patterns are first measured by a measuring SEM. An optimum recipe 1 is selected which realizes desired pattern widths relative to those measured resist pattern widths. At a next Step S12, the lot is divided into a pilot wafer and other wafers. At a next Step S13, the pilot wafer is etched by the selected optimum recipe 1.

At a next Step S14, the resist of the etched pilot wafer is ashed and washed to expose actually obtained patterns.

At Step S15, the obtained pattern width is measured by a measuring SEM. If there is a difference from a desired pattern width, it is checked how the optimum recipe is corrected in order to remove the difference, and a corrected optimum recipe 2 is obtained. At Step S16, the remaining wafers are etched by the corrected optimum recipe 2.

At Step S17, the resist after the etching is ashed and the whole surfaces of the wafers are washed. At Step S18, the obtained pattern width is measured by a measuring SEM and the measurement results are fed back to the controller.

The pilot wafer is used for checking the results in advance, and if the first selected optimum recipe 1 is not proper, the optimum recipe is corrected to obtain a new optimum recipe and process the remaining wafers.

Figure 23A:
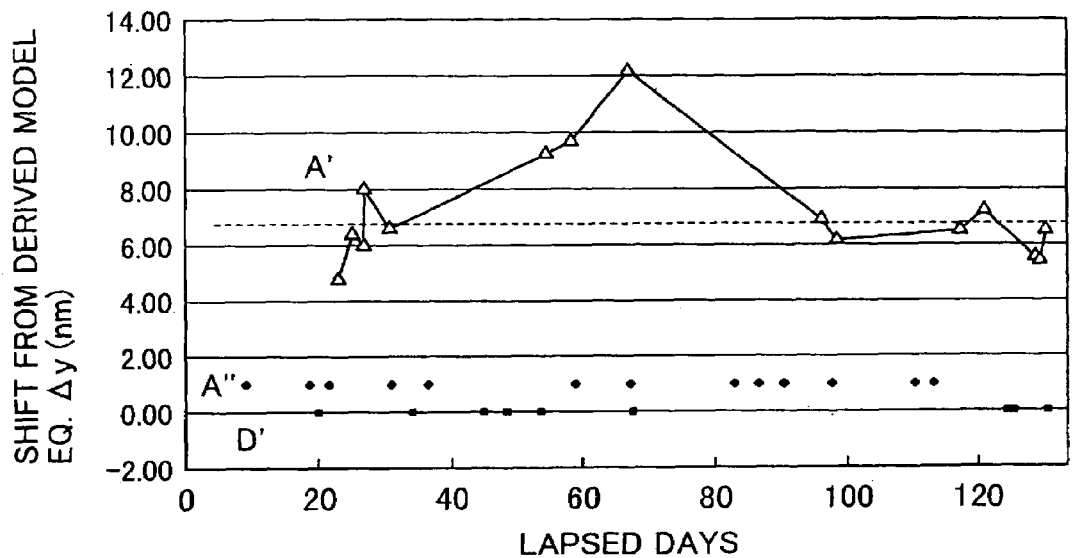
FIGS. 23A and 23B are graphs showing the experiment results of the etching processes with and without a pilot wafer.

FIG. 23A is a graph showing an example of the characteristics of the etching not using the pilot wafer. The abscissa represents the number of lapsed days, and A', A" and D' represent the types of the layouts of semiconductor integrated circuit devices. The layouts A' and A" are similar and the layout D' is very different from the layouts A' and A". The ordinate represents a shift of the gate length reduction amount from the model equation. The position of a broken line indicates a standard value for the layout A'.

It can be recognized that if the etching for the product type D' having a very different layout is mixed, a shift of the gate length reduction amount of the layout A' changes greatly. In the last half of the graph without the etching for D', the disturbance is gradually relaxed and takes a constant value. In this manner, if the layout of a wafer to be processed changes, a large disturbance of the etching results may occur. The etching characteristics after the long term use may gradually drift. The pilot wafer scheme can deal with these changes.

Figure 23B:
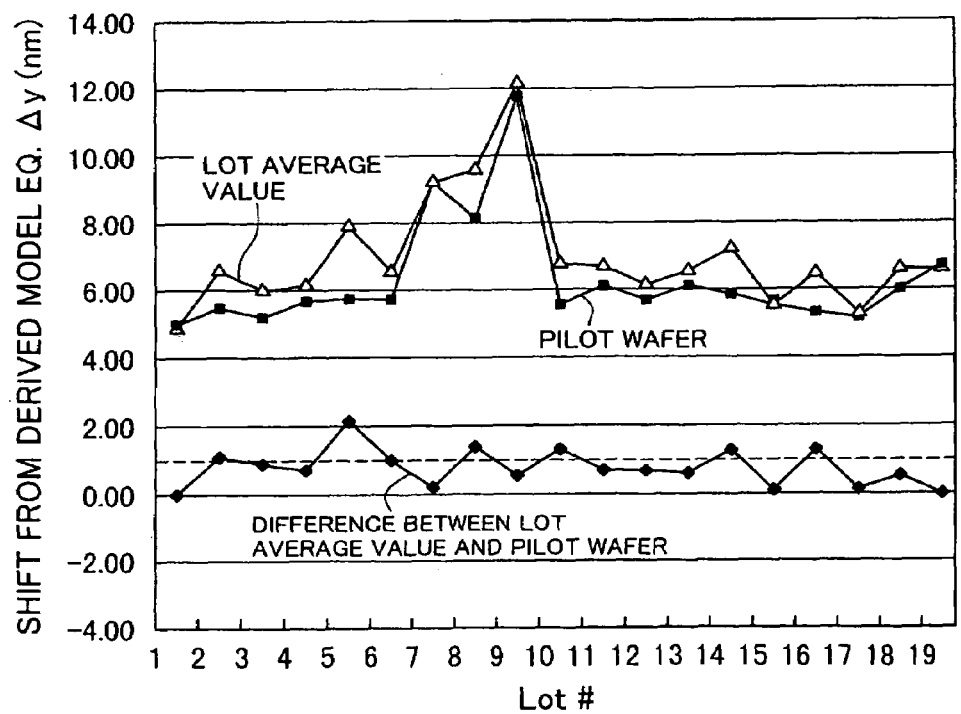

FIG. 23B shows the results of etching a lot after the pilot wafer is etched. The lower area of the graph shows a difference between a pilot wafer value and a lot average value. A difference between the lot average value and pilot wafer value is converged in a narrow range. Therefore, the results are obtained from the pilot wafer, and the correction is made in accordance with the results so that the lot average value can be converged in a narrow range.

A difference between the lot average value and the pilot wafer value is about 1 nm. This value is called first wafer effects. As a number of wafers are processed, there is the tendency that the results gradually drift. It is preferable to adopt the first wafer effects when the etching conditions of a lot are to be determined by feeding back the results of the pilot wafer.

Although pilot wafers may be adopted for all lots, if the lots of the same or similar product type are to be continuously processed, it is expected that adopting pilot wafers for all lots is rare. If the obtained results shift from the desired value by 1 nm or larger after the etching process, it is desired to adopt a pilot wafer. When the product type having a very different layout is to be processed, it is desired to adopt a pilot wafer. It is not limited to only a single pilot wafer per lot, but a plurality of pilot wafers per lot may be used. A pilot wafer may be a wafer at the middle of a lot. Measuring a resist pattern may not be executed for all wafers. Measuring may be executed for the pilot wafer and only a portion of remaining wafers to perform data feed forward and data feedback.

The present invention has been described in connection with the preferred embodiments. The invention is not limited only to the above embodiments. For example, the etching gas is not limited to the mixed gas of $He/SO_2/O_2$, but other mixed gases having similar characteristics may also be used. It will be apparent to those skilled in the art that other various modifications, improvements, combinations, and the like can be made.

What we claim are:

1. A semiconductor device manufacture method comprising steps of:
    (a) preparing a semiconductor substrate having a work target layer;
    (b) forming a resist layer above said work target layer;
    (c) exposing and developing said resist layer to form resist patterns including an isolated pattern and a dense pattern;
    (d) monitoring widths of isolated pattern and dense pattern of said resist patterns to determine trimming amounts of widths to be reduced;
    (e) determining etching conditions realizing said trimming amounts of both the isolated and dense patterns, the etching conditions using mixed gas comprising a first gas having a function of mainly enhancing etching and a second gas having a function of mainly suppressing etching;
    (f) trimming said resist patterns under said determined etching conditions; and
    (g) etching said work target layer by using said trimmed resist patterns
    wherein the etching conditions in said step (e) use at least one of etching time period and mixing ratio of the mixed gas as a variable.

2. The semiconductor device manufacture method according to claim 1, wherein said step (e) executes etching process under first etching conditions for part of a plurality of semiconductor devices, measures the trimming amounts, and corrects the first etching conditions by considering the measurement results to obtain second etching conditions for realizing said trimming amounts.

3. The semiconductor device manufacture method according to claim 1, wherein said step (b) laminates a BARC layer and said resist layer, said step (e) determines the etching conditions of main-etching and thereafter over-etching said BARC layer and trimming said resist layer, and said step (f) etches said BARC layer and trims said resist layer.

4. The semiconductor device manufacture method according to claim 3, wherein the first gas having the function of mainly enhancing etching is $O_2$ gas and the second gas having the function of mainly suppressing etching is $SO_2$ gas.

5. The semiconductor device manufacture method according to claim 3, wherein the etching conditions in said step (e) include a constant over etching time and a gas-flow-rate fraction at which the trimming amounts of the isolated and dense patterns become substantially equal.

6. The semiconductor device manufacture method according to claim 1, wherein said work target layer is a polysilicon layer for forming gate electrodes.

7. The semiconductor device manufacture method according to claim 6, wherein said work target layer further includes a hard mask layer formed on said polysilicon layer.

8. The semiconductor device manufacture method according to claim 1, wherein said step (c) forms the isolated pattern and the dense pattern having a different linewidth from a linewidth of the isolated pattern, said step (d) determines different trimming amounts for the isolated and dense patterns, and said step (e) determines also etching conditions of auxiliary etching which does not hardly change the pattern linewidth of one of the isolated and dense patterns and reduces the pattern linewidth of the other, and the semiconductor device manufacture method further comprises:
    (h) auxiliary-etching said resist pattern.

9. The semiconductor device manufacture method according to claim 8, wherein said step (h) is executed in He atmosphere.

10. The semiconductor device manufacture method according to claim 1, wherein said mixed gas further comprises a third gas not chemically reacting with said work target layer.

11. The semiconductor device manufacture method according to claim 10, wherein the etching conditions in said step (e) uses as a variable at least one of etching time period, a first mixture ratio of the first gas and the second gas, a second mixture ratio of the third gas to, the first and the second gases, and total flow rate of said mixed gas.

12. The semiconductor device manufacture method according to claim 11, wherein said step (e) uses said first mixture ratio and said second mixture ratio as parameters and determines the etching conditions realizing said trimming amounts of both the isolated and dense patterns.

13. The semiconductor device manufacture method according to claim 12, wherein said step (e) uses equations expressing the trimming amounts of the isolated and dense patterns as linear functions of said first mixture ratio and said second mixture ratio.

14. The semiconductor device manufacture method according to claim 13, wherein said step (e) performs correction considering errors caused by using the equations of linear function.

15. An etching system comprising:
a measuring apparatus capable of measuring a pattern linewidth;
an etching apparatus capable controlled trimming of a resist pattern comprising both isolated and dense pattern line widths by using mixed gas of a gas having a function of mainly enhancing etching and a gas having a function of mainly suppressing etching, and thereafter etching a work target layer under the resist pattern; and
a controller for storing data representative of relation between isolated and dense pattern linewidths of the resist pattern, and isolated and dense pattern widths of the work target layer after etching, the relation depending upon etching conditions of the etching using the mixed gas, and etching conditions capable of realizing desired trimming amounts of the isolated and the dense pattern linewidths from given resist pattern,
wherein said measuring apparatus has a feed forward system of measuring the pattern linewidth of the resist pattern and transfer the measurement results to said controller, and said controller determines the etching conditions in accordance with the transferred resist pattern linewidth and controls said etching apparatus.

16. The etching system according to claim 15, wherein said measuring apparatus includes a feedback system of measuring pattern linewidth after etching and transferring the measurement results to said controller, and said controller corrects data in accordance with the feed-back value.

17. The etching system according to claim 15, wherein said measuring apparatus further includes a feedback system of measuring a pattern linewidth of the work target layer after etching and transferring the measurement results to said controller, and said controller calculates the trimming amounts from resist pattern width of a pilot wafer and a pattern width of the work target layer of the pilot wafer after etching, calculates change amounts through comparison between the calculation results and said data, and determines etching conditions corrected by said etching conditions and said change amounts to control said etching apparatus.

18. The etching system according to claim 15, wherein the etching conditions determined by said controller are over etching time and mixing ratio the mixed gas for realizing different trimming amounts for the isolated and dense patterns respectively in a first mode, and are mixing ratio of the mixed gas for realizing substantially same trimming amount for the isolated and dense patterns in a second mode.

19. The etching system according to claim 18, wherein the etching conditions determined by said controller further include etching conditions substantially trimming only one of the isolated and dense patterns.

* * * * *